(12) United States Patent
Chuang et al.

(10) Patent No.: US 11,249,131 B2
(45) Date of Patent: Feb. 15, 2022

(54) TEST APPARATUS AND TESTING METHOD USING THE SAME

(71) Applicant: TAIWAN SEMICONDUCTOR MANUFACTURING COMPANY LTD., Hsinchu (TW)

(72) Inventors: Harry-Hak-Lay Chuang, Hsinchu County (TW); Tien-Wei Chiang, Taipei (TW); Chia Yu Wang, Hsinchu County (TW); Meng-Chun Shih, Hsinchu (TW); Ching-Huang Wang, Taoyuan County (TW); Chih-Yang Chang, Hsinchu (TW); Chia-Hsiang Chen, Hsinchu (TW); Chih-Hui Weng, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 128 days.

(21) Appl. No.: 16/837,906

(22) Filed: Apr. 1, 2020

(65) Prior Publication Data
US 2021/0311105 A1 Oct. 7, 2021

(51) Int. Cl.
*G01R 31/02* (2006.01)
*G01R 31/26* (2020.01)
*G01R 31/28* (2006.01)
*H01L 21/66* (2006.01)

(52) U.S. Cl.
CPC ........ *G01R 31/2642* (2013.01); *G01R 31/26* (2013.01); *G01R 31/2601* (2013.01); *G01R 31/2621* (2013.01); *G01R 31/2628* (2013.01); *G01R 31/2841* (2013.01); *H01L 22/34* (2013.01); *H01L 2924/00* (2013.01); *H01L 2924/0002* (2013.01); *H01L 2924/00014* (2013.01)

(58) Field of Classification Search
CPC ......... H01L 2924/0002; H01L 2924/00; H01L 2924/00014; H01L 22/34; G01R 31/2601; G01R 31/26; G01R 31/2642; G01R 31/2621; G01R 31/2628; G01R 31/2841
USPC ......... 324/71, 378, 403, 415, 425, 500, 537, 324/762.01
See application file for complete search history.

(56) References Cited

U.S. PATENT DOCUMENTS

| 2010/0283456 A1* | 11/2010 | Zieren ..................... H01L 23/57 324/244 |
| 2020/0096559 A1* | 3/2020 | Chuang ............ G11C 29/56016 |
| 2021/0109152 A1* | 4/2021 | Chuang ............... G11C 11/1673 |

* cited by examiner

*Primary Examiner* — Raul J Rios Russo
(74) *Attorney, Agent, or Firm* — WPAT, P.C., Intellectual Property Attorneys; Anthony King

(57) ABSTRACT

A test apparatus includes a tray including at least a first region and a second region, and a cap disposed over the tray. The cap includes a cap body, and at least a first magnet and a second magnet disposed over the cap body. The first magnet is configured to provide a first magnetic field to the first region of the tray, and the second magnet is configured to provide a second magnetic field to the second region of the tray. A strength of the first magnetic field is different from a strength of the second magnetic field.

20 Claims, 17 Drawing Sheets

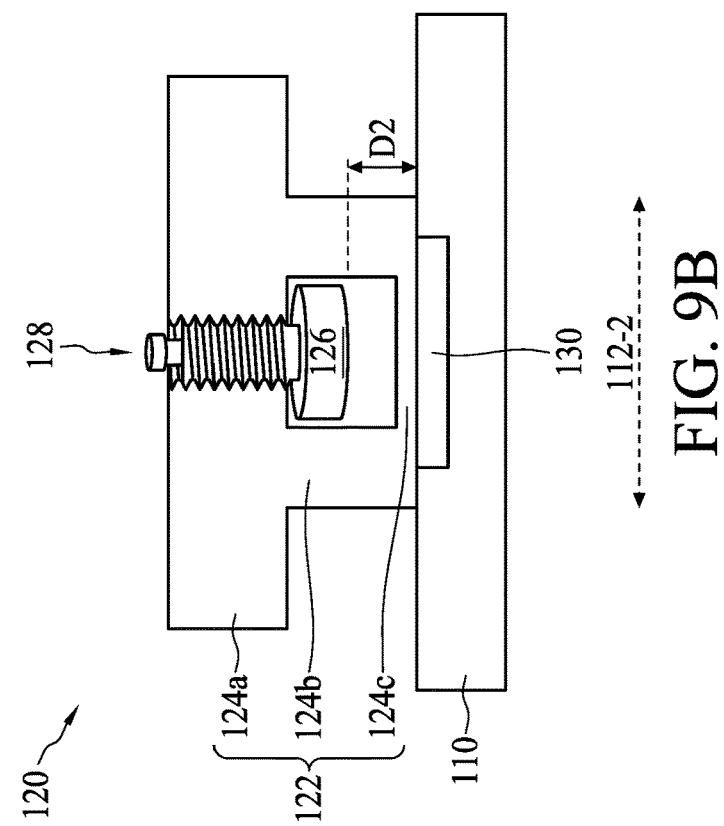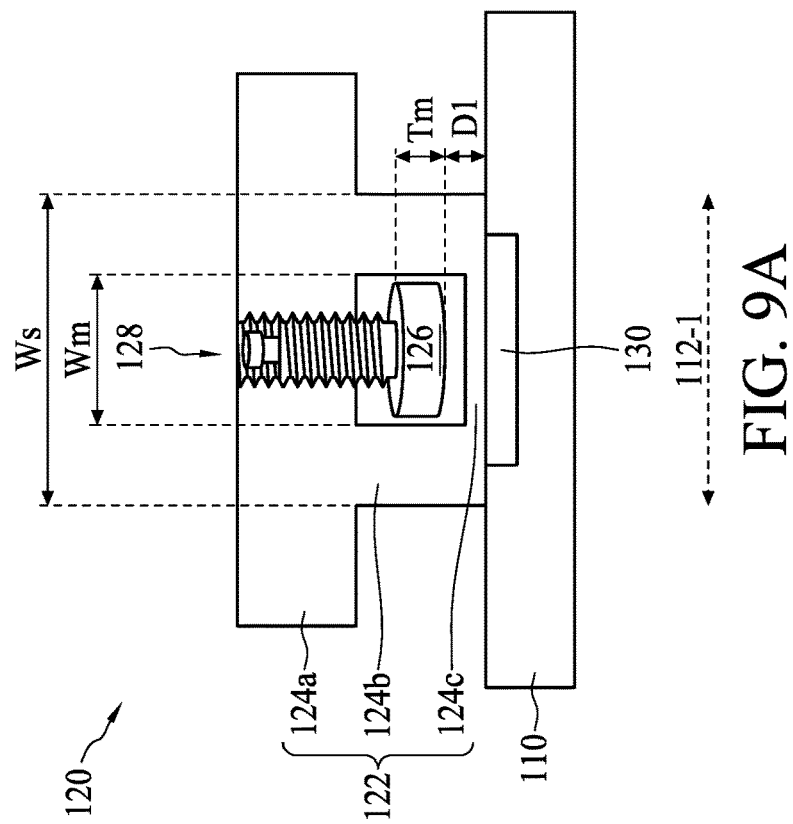

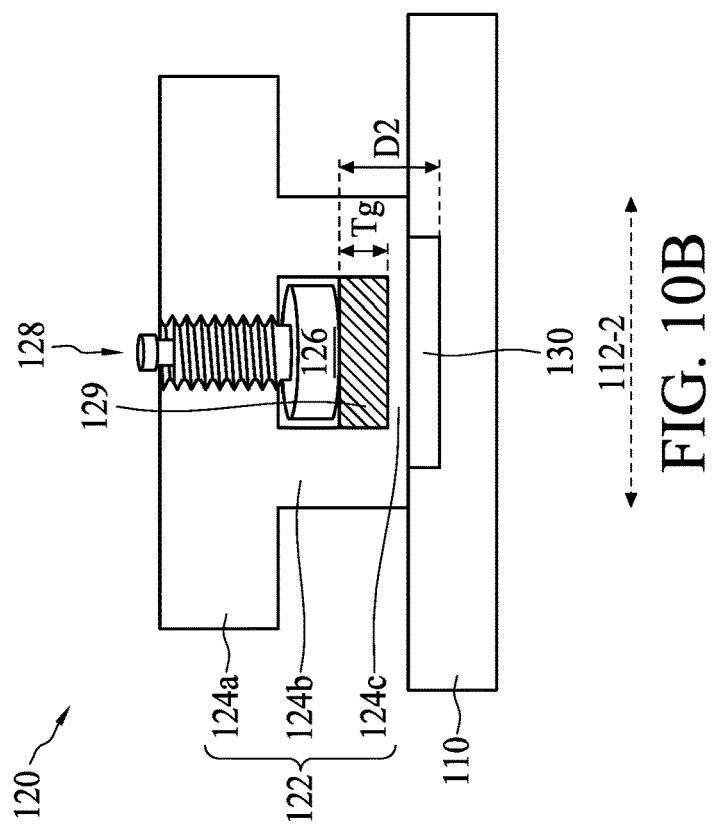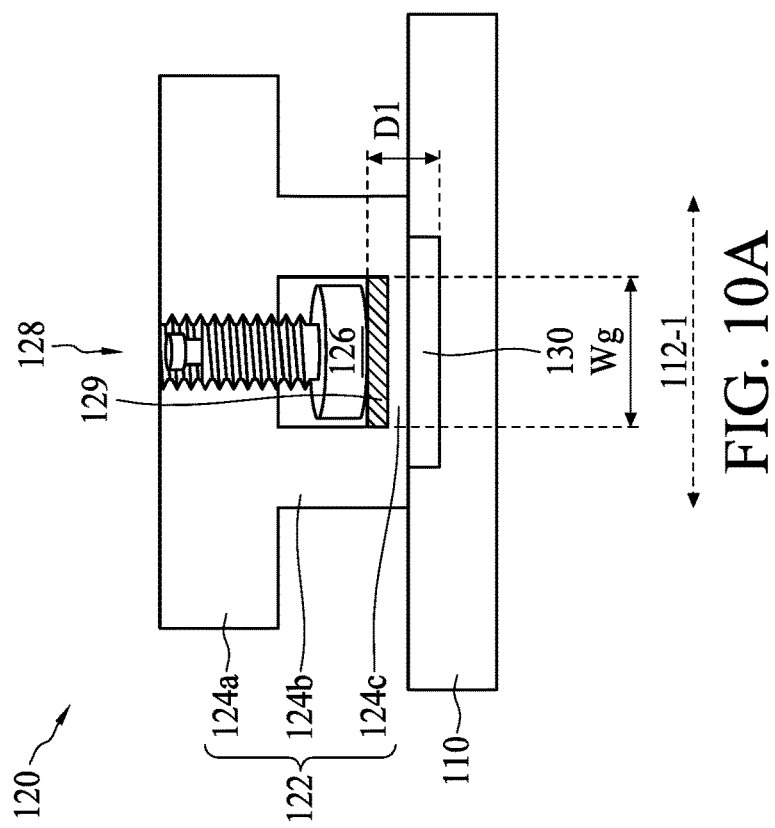

TEST APPARATUS AND TESTING METHOD USING THE SAME

BACKGROUND

Semiconductor devices are used in variety of electronic applications, such as personal computers, cell phones, digital cameras and other electronic equipment. Semiconductor devices are typically fabricated by sequentially depositing insulating or dielectric layers, conductive layers and semiconductive layers of material over a semiconductor substrate, and patterning the various material layers using lithography to form circuit components and elements thereon.

During the fabricating of the semiconductor devices or after the forming of the semiconductor devices, characterization is performed, so that quantities such as depletion width, carrier concentration, optical generation and recombination rate, carrier lifetimes, defect concentration, trap states, etc. can be characterized. Characterization of the semiconductor devices helps the manufacturer understand or describe behaviors of the semiconductor devices under a variety of conditions in order to facilitate further development of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A and 9B are cross-sectional views of a test apparatus according to aspects of the present disclosure.

FIGS. 10A and 10B are cross-sectional views of a test apparatus according to aspects of the present disclosure.

DETAILED DESCRIPTION

Figure 1:
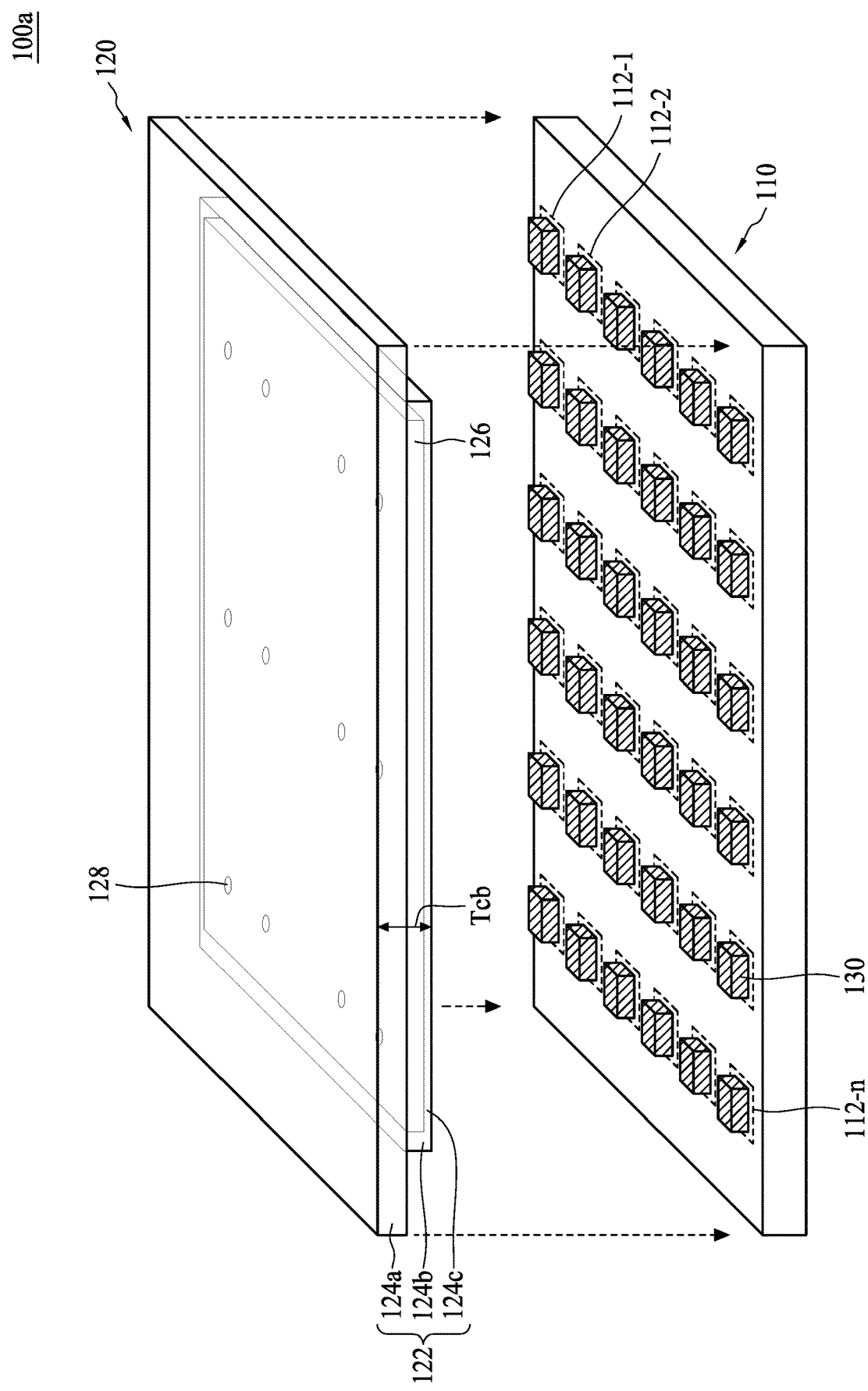
FIG. 1 is a schematic drawing illustrating a test apparatus according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Semiconductor devices are delicate and sensitive to contamination, humidity, temperature, supply voltage level, electric field, and the like. As technology nodes achieve progressive smaller scales, semiconductor devices are more sensitive to, for example, magnetic field. In some embodiments, semiconductor devices such as magnetic random access memory (MRAM) cells and magnetic field strength sensors are very sensitive to external electric field. Such sensitivity may be problematic when it is desired that the semiconductor devices of the same design and manufacture perform consistently. Therefore, magnetic property characterization is important in order to build, for example, magnetic field strength immunity.

The present disclosure provides a test apparatus having a cap capable of generating magnetic fields and adjusting magnetic field strengths. In some embodiments, the cap includes adjustment members that can be respectively adjusted, enabling the cap to provide magnetic fields of different strengths. The test apparatus adopting the cap can be used in characterization testing, wherein influence from the different magnetic fields on the semiconductor devices can be observed and the magnetic property characterization of the semiconductor device can be obtained. Further, because the cap can be used in different characterization tests for different semiconductor devices, flexibility of the test apparatus is improved.

FIG. 1 is a schematic drawing illustrating a test apparatus according to aspects of the present disclosure. In some embodiments, a test apparatus 100a is provided. The test apparatus 100a includes a tray 110 and a cap 120. As shown in FIG. 1, the tray 110 and the cap 120 can have a same size, so that the cap 120 can cover the tray 110 entirely, but the disclosure is not limited thereto. In some embodiments, the tray 110 can include a plurality of regions, such as a first region 112-1 and a second region 112-2 to an nth region 112-n. In some embodiments, the regions 112-1 and 112-2 to 112-n can have the same size. In some alternative embodiments, the regions 112-1 and 112-2 to 112-n can have different sizes. Each of the regions 112-1 and 112-2 to 112-n is defined over the tray 110 to accommodate a workpiece 130 to be tested. In some embodiments, the regions 112-1 and 112-2 to 112-n are defined to be arranged in columns and rows, and therefore the workpieces 130 disposed in the regions 112-1 and 112-2 to 112-n are arranged to form an array, but the disclosure is not limited thereto. In some embodiments, the workpieces 130 to be tested are magnetic field sensitive ICs. In some embodiments, the workpieces 130 to be tested are magnetic field sensitive devices such as MRAM ICs, but the disclosure is not limited thereto. In some embodiments, same workpieces 130 are respectively disposed in the regions 112-1 and 112-2 to 112-n of the tray 110. In some other embodiments, different workpieces 130 are respectively disposed in the regions 112-1 and 112-2 to 112-n of the tray 110.

The cap 120 can be disposed over the tray 110, as shown in FIG. 1, in accordance with some embodiments. The cap 120 has a cap body 122. In some embodiments, a thickness Tcb of the cap body 122 is between approximately 10 mm and approximately 20 mm, but the disclosure is not limited thereto. In some embodiments, the cap body 122 can have a base 124a and a separating member 124b disposed over the base 124a. In some embodiments, the cap body 122 can have a sealing member 124c disposed over the separating member 124b. The base 124a, the separating member 124b and the sealing member 124c of the cap body 122 can include the same material. In some embodiments, the base 124a, the separating member 124b and the sealing member 124c of the cap body 122 can include a non-magnetic material such as, for example but not limited thereto, a non-magnetic metal, ceramic, polymer, the like, or a combination thereof. In some embodiments, the base 124a, the separating member 124b and the sealing member 124c of the cap body 122 are monolithic.

Still referring to FIG. 1, the cap 120 further includes at least a magnet 126. In some embodiments, the magnet 126 is a permanent magnet, but the disclosure is not limited thereto. A dimension of the magnet 126 can be less than that of the base 124a of the cap body 122. However, the magnet 126 entirely overlaps each of the regions of the tray 110. Significantly, the magnet 126 overlaps every workpiece 130, but the disclosure is not limited thereto. In some embodiments, the magnet 126 is sealed within a space formed by the base 124a, the separating member 124b and the sealing member 124c. In some alternative embodiments, the magnet 126 is surrounded by the separating member 124b. In some embodiments, the magnet 126 is exposed to the tray 110. In some embodiments, the magnet 126 is attached to and fixed to the base 124a of the cap body 122; and different approaches to fixing the magnet 126 to the base 124a will be discussed in the following description. In some embodiments, the cap 120 further includes an adjustment member 128 disposed over the separating member 124b, and the magnet 126 is disposed within a space formed by the base 124a, the separating member 124b and the adjustment member 126. In such embodiments, the base 124a and the separating member 124b of the cap body 122 are monolithic. The adjustment member 128 is configured to adjust a vertical distance between the magnet 126 and the tray 110. In other embodiments, the magnet 126 is disposed over the base 124a of the cap body 122, and a distance between the magnet 126 and the base 124a can be adjusted. In such embodiments, the cap 120 further includes an adjustment member 128 disposed between the base 124a and the magnet 126, and the adjustment member 128 is configured to adjust the distance between the magnet 126 and the base 124a of the cap body 122. Different approaches to applying the adjustment member 128 will be discussed in the following description.

Figure 2:
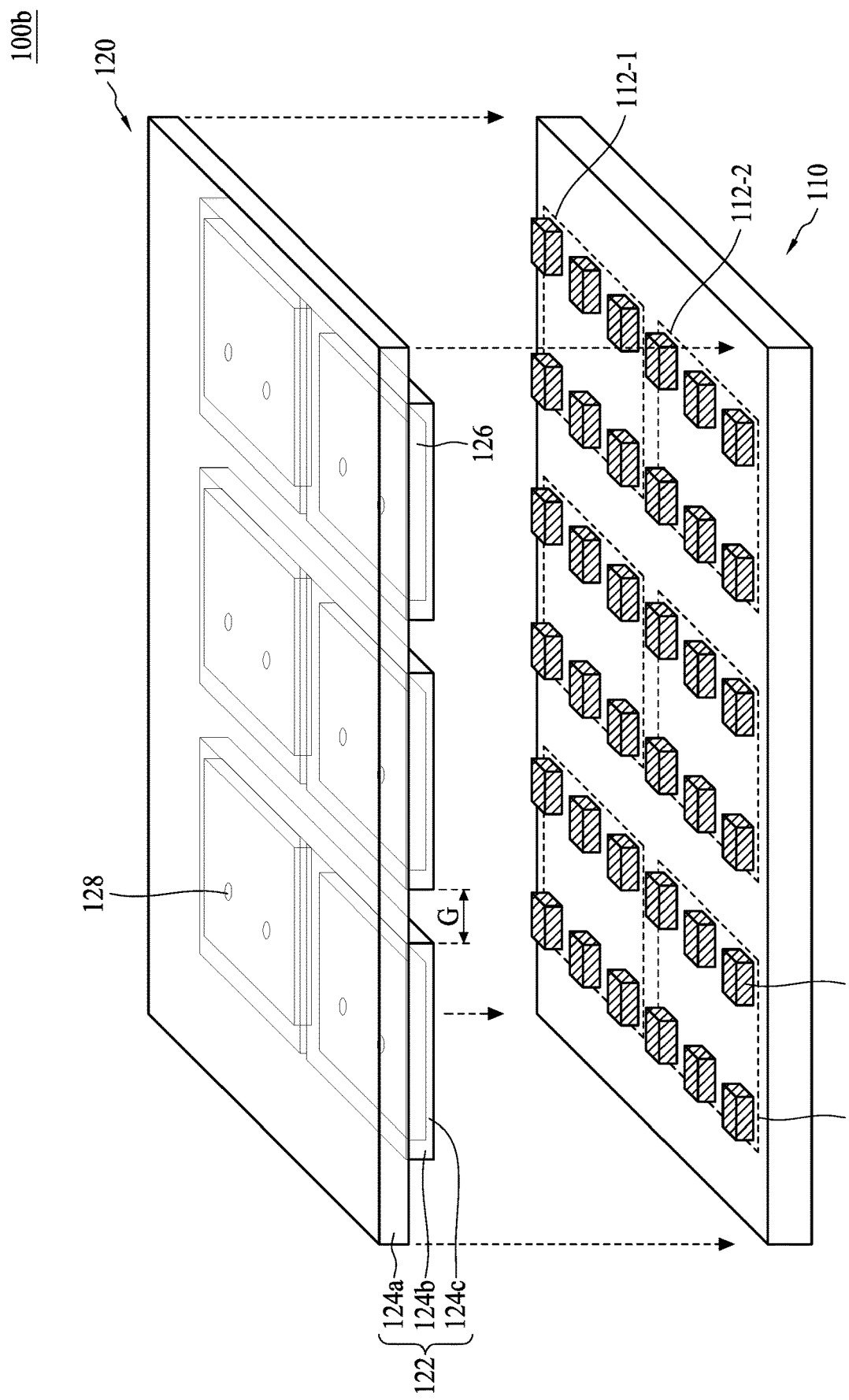
FIG. 2 is a schematic drawing illustrating a test apparatus according to aspects of the present disclosure.

FIG. 2 is a schematic drawing illustrating a test apparatus according to aspects of the present disclosure. It should be noted that same elements in FIGS. 1 and 2 are indicated by the same numerals, and details of the same elements shown in FIGS. 1 and 2 are omitted in the description of FIG. 2 for brevity. In some embodiments, a test apparatus 100b is provided. The test apparatus 100b includes a tray 110 and a cap 120. In some embodiments, the tray 110 can include a plurality of regions, such as a first region 112-1 and a second region 112-2 to an nth region 112-n. Each of the regions 112-1 and 112-2 to 112-n is defined over the tray 110 to accommodate a plurality of workpieces 130 to be tested. In some embodiments, the regions 112-1 and 112-2 to 112-n are defined to have rectangular shapes and arranged in columns and rows. Further, the workpieces 130 disposed in each region 112-1 and 112-2 to 112-n are arranged to form an array, but the disclosure is not limited thereto. In some embodiments, the workpieces 130 to be tested are magnetic field sensitive devices. In some embodiments, there are different workpieces 130 in region 112-1, and such arrangement of different workpieces 130 is duplicated in other regions 112-2 to 112-n. In other embodiments, same workpieces 130 are respectively disposed in the regions 112-1 and 112-2 to 112-n of the tray 110, but different regions 112-1 and 112-2 to 112-n accommodate different workpieces 130.

The cap 120 can be disposed over the tray 110, as shown in FIG. 2. The cap 120 has a cap body 122. The cap body 122 can have a base 124a and a plurality of separating members 124b disposed over the base 124a. In such embodiments, the separating members 124b may be separated from each other, and thus a gap G may be formed between the adjacent separating members 124b, as shown in FIG. 2. In some embodiments, the cap body 122 can have a plurality of sealing members 124c disposed over the separating members 124b. In such embodiments, each sealing member 124c is disposed over one separating member 124b, as shown in FIG. 2.

Still referring to FIG. 2, the cap 120 further includes a plurality of magnets 126. In some embodiments, the magnets 126 are permanent magnets, but the disclosure is not limited thereto. In some embodiments, each of the magnets 126 is sealed within a space formed by the base 124a, the separating member 124b and the sealing member 124c. In some alternative embodiments, each of the magnets 126 is surrounded by other magnets 126 and separated from the other magnets 126 by the separating member 124b. In some embodiments, the magnets 126 are exposed to the tray 110. As mentioned above, each of the magnets 126 can be attached to and fixed to the base 124a of the cap body 122, and different approaches to fixing the magnet 126 to the base 124a will be discussed in the following description. In some embodiments, the cap 120 further includes an adjustment member 128 disposed over the separating member 124b, and the magnet 126 is disposed within a space formed by the base 124a, the separating member 124b and the adjustment member 128. The adjustment member 128 is configured to adjust a vertical distance between the magnet 126 and the tray 110. Different approaches to applying the adjustment member 128 will be discussed in the following description. In other embodiments, the magnet 126 is disposed over the base 124a of the cap body 122, and a distance between the magnet 126 and the base 124a can be adjusted. In such embodiments, the cap 120 further includes an adjustment member 128 disposed between the base 124a and the magnet 126, and the adjustment member 128 is configured to adjust the distance between the magnet 126 and the base 124a of the cap body 122. Additionally, the separating members 124b also separate the adjustment members 128 from each other.

In some embodiments, a dimension of each of the magnets 126 is less than that of the base 124a of the cap body 122, but each of the magnets 126 entirely overlaps one region 112-1 and 112-2 to 112-n of the tray 110. Further, each of the magnets 126 overlaps the plurality of workpieces 130 in each region 112-1 and 112-2 to 112-n, as shown in FIG. 2. Additionally, the magnets 126 can be arranged to form an array that corresponds to the array formed by the regions 112-1 and 112-2 to 112-n.

Figure 3:
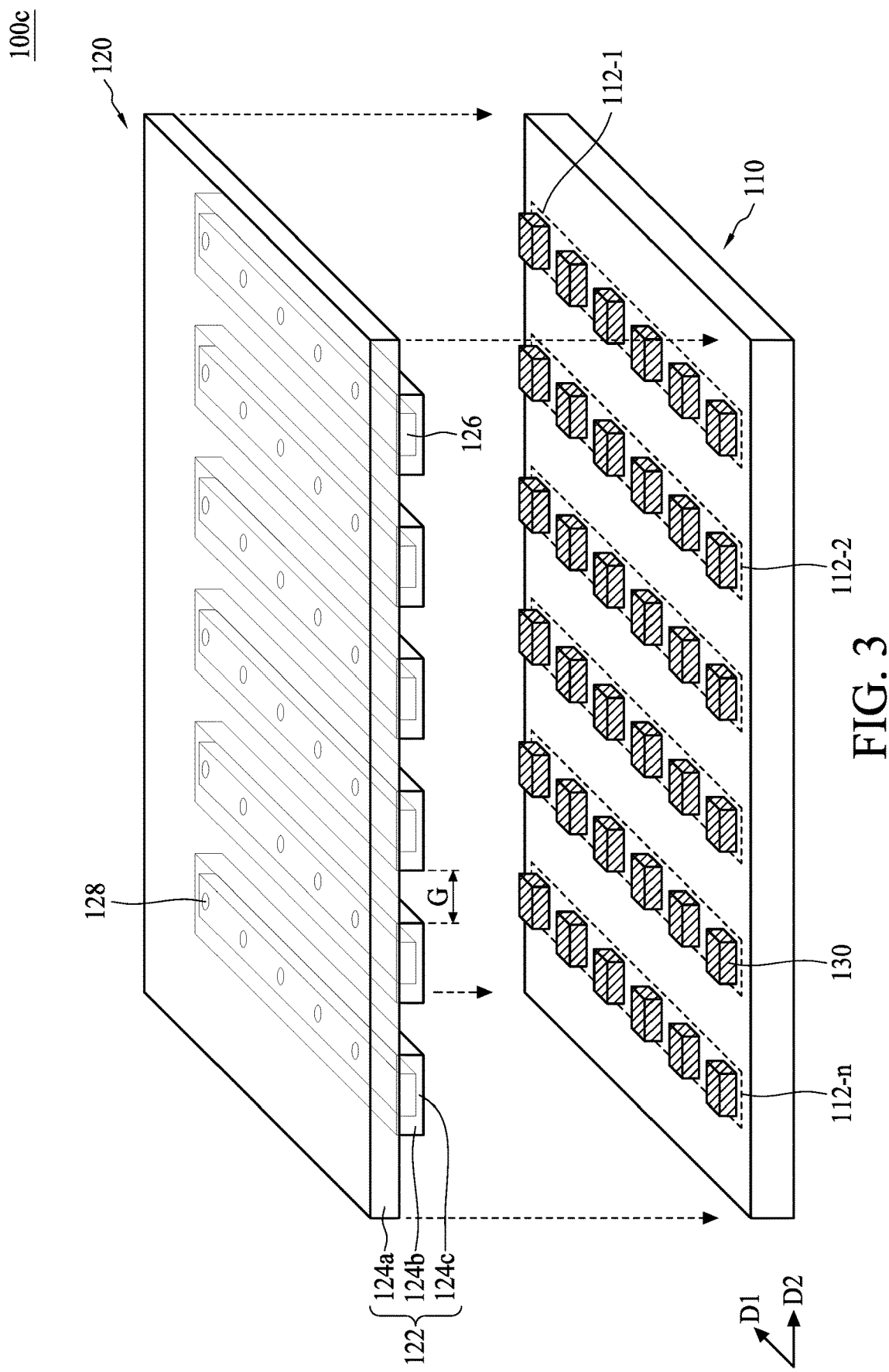
FIG. 3 is a schematic drawing illustrating a test apparatus according to aspects of the present disclosure.

FIG. 3 is a schematic drawing illustrating a test apparatus according to aspects of the present disclosure. It should be noted that same elements in FIGS. 1 and 3 are indicated by the same numerals, and details of the same elements shown in FIGS. 1 and 3 are omitted in the description of FIG. 3 for brevity. In some embodiments, a test apparatus 100c is provided. The test apparatus 100c includes a tray 110 and a cap 120. In some embodiments, the tray 110 can include a plurality of regions, such as a first region 112-1 and a second region 112-2 to an nth region 112-n. Each of the regions 112-1 and 112-2 to 112-n is defined over the tray 110 to accommodate a plurality of workpieces 130 to be tested. In some embodiments, the regions 112-1 and 112-2 to 112-n are defined to have a long strip shape. In some embodiments, the regions 112-1 and 112-2 to 112-n extend along a first direction D1 and are arranged along a second direction D2 different from the first direction D1. In some embodiments, the first direction D1 and the second direction are perpendicular, but the disclosure is not limited thereto. In some embodiments, the workpieces 130 disposed in each region 112-1 and 112-2 to 112-n are arranged along the first direction D1, but the disclosure is not limited thereto. In some embodiments, the workpieces 130 to be tested are magnetic field sensitive devices such as MRAM ICs, but the disclosure is not limited thereto. In some embodiments, there are different workpieces 130 in region 112-1, and such arrangement of different workpieces 130 is duplicated in other regions 112-2 to 112-n. In other embodiments, same workpieces 130 are respectively disposed in the regions 112-1 and 112-2 to 112-n of the tray 110, but different regions 112-1 and 112-2 to 112-n accommodate different workpieces 130.

The cap 120 can be disposed over the tray 110, as shown in FIG. 3. The cap 120 has a cap body 122. The cap body 122 can have a base 124a and a plurality of separating members 124b disposed over the base 124a. In such embodiments, the separating members 124b may be separated from each other, and thus a gap G may be formed between the adjacent separating members 124b, as shown in FIG. 3. In some embodiments, the cap body 122 can have a plurality of sealing members 124c disposed over the separating members 124b. In such embodiments, each sealing member 124c is disposed over one separating member 124b, as shown in FIG. 3.

Still referring to FIG. 3, the cap 120 further includes a plurality of magnets 126. In some embodiments, the magnets 126 are permanent magnets, but the disclosure is not limited thereto. In some embodiments, each of the magnets 126 is sealed within a space formed by the base 124a, the separating member 124b and the sealing member 124c. In some alternative embodiments, each of the magnets 126 is surrounded by other magnets 126 and separated from the other magnets 126 by the separating member 124b. In some embodiments, each of the magnets 126 is exposed to the tray 110. In some embodiments, the cap 120 further includes adjustment member 128, and different approaches to applying the adjustment member 128 will be discussed in the following description.

In some embodiments, a dimension of each of the magnets 126 is less than that of the base 124a of the cap body 122, but each of the magnets 126 entirely overlaps one region 112-1 and 112-2 to 112-n of the tray 110. Further, each of the magnets 126 overlaps the plurality of workpieces 130 in each region 112-1 and 112-2 to 112-$n$, as shown in FIG. 3. Additionally, the magnets 126 can be correspondingly arranged to the regions 112-1 and 112-2 to 112-$n$.

Figure 4:
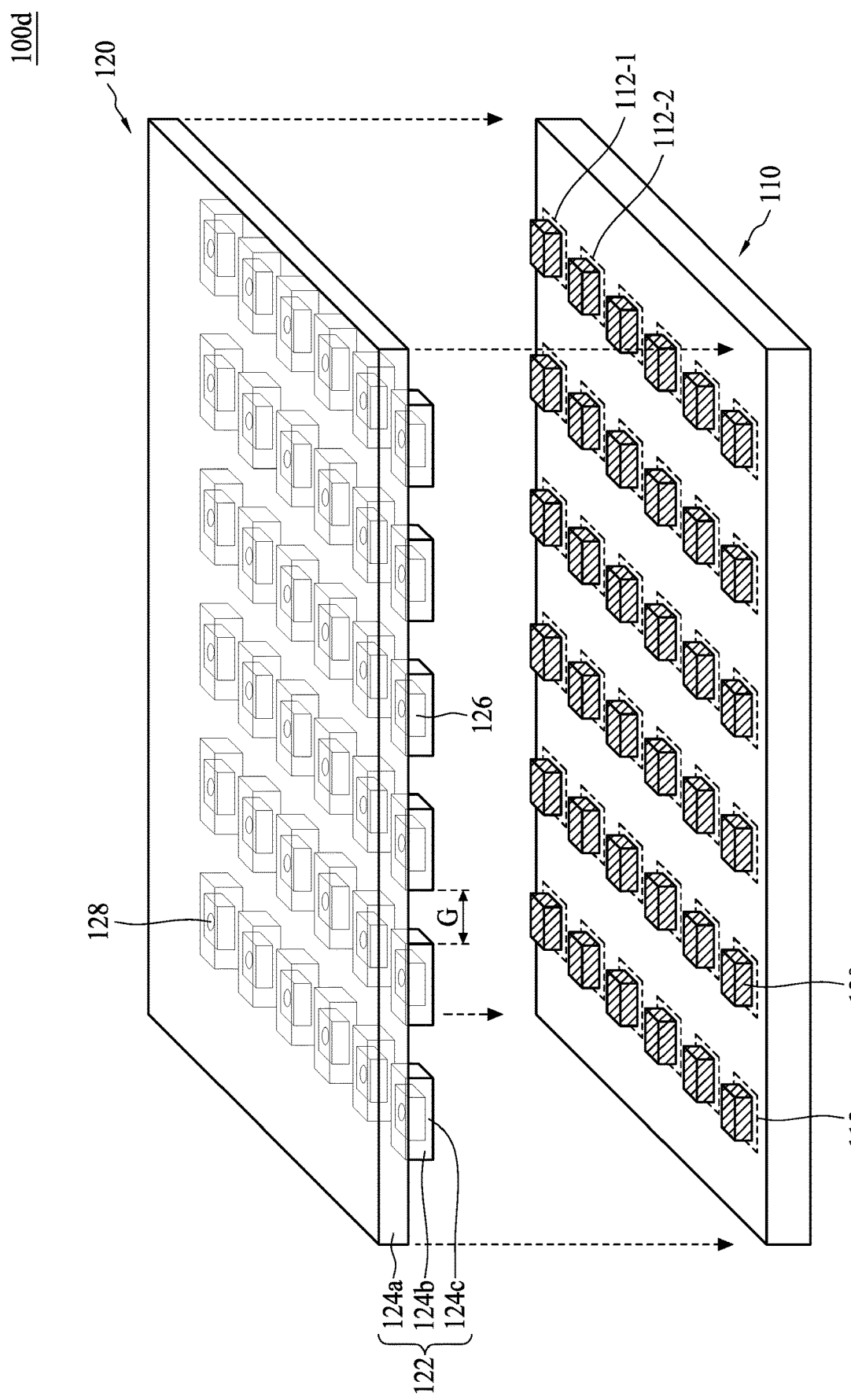
FIG. 4 is a schematic drawing illustrating a test apparatus according to aspects of the present disclosure.

FIG. 4 is a schematic drawing illustrating a test apparatus according to aspects of the present disclosure. It should be noted that same elements in FIGS. 1 and 4 are indicated by the same numerals, and details of the same elements shown in FIGS. 1 and 4 are omitted in the description of FIG. 4 for brevity. In some embodiments, a test apparatus 100$d$ is provided. The test apparatus 100$d$ includes a tray 110 and a cap 120. In some embodiments, the tray 110 can include a plurality of regions, such as a first region 112-1 and a second region 112-2 to an nth region 112-$n$. Each of the regions 112-1 and 112-2 to 112-$n$ is defined over the tray 110 to accommodate a workpiece 130 to be tested. In some embodiments, the workpieces 130 to be tested are magnetic field sensitive devices such as MRAM ICs, but the disclosure is not limited thereto. In some embodiments, same workpieces 130 are respectively disposed in the regions 112-1 and 112-2 to 112-$n$ of the tray 110. In other embodiments, different workpieces 130 are respectively disposed in the regions 112-1 and 112-2 to 112-$n$ of the tray 110.

The cap 120 can be disposed over the tray 110, as shown in FIG. 4. The cap 120 has a cap body 122. The cap body 122 can have a base 124$a$ and a plurality of separating members 124$b$ disposed over the base 124$a$. In such embodiments, the separating members 124$b$ may be separated from each other, and thus a gap G may be formed between the adjacent separating members 124$b$, as shown in FIG. 4. In some embodiments, the cap body 122 can have a plurality of sealing members 124$c$ disposed over the separating members 124$b$ In such embodiments, each sealing member 124$c$ is disposed over one separating member 124$b$, as shown in FIG. 4.

Still referring to FIG. 4, the cap 120 further includes a plurality of magnets 126. In some embodiments, the magnets 126 are permanent magnets, but the disclosure is not limited thereto. In some embodiments, each of the magnets 126 is sealed within a space formed by the base 124$a$, the separating member 124$b$ and the sealing member 124$c$. In some alternative embodiments, each of the magnets 126 is surrounded by other magnet 126 and separated from the other magnets 126 by the separating member 124$b$. In some embodiments, each of the magnets 126 is exposed to the tray 110. In some embodiments, the cap 120 further includes an adjustment member 128, and different approaches to applying the adjustment member 128 will be discussed in the following description.

In some embodiments, a dimension of each of the magnets 126 is less than that of the base 124$a$ of the cap body 122, but each of the magnets 126 entirely overlaps one region 112-1 and 112-2 to 112-$n$ of the tray 110. Further, each of the magnets 126 overlaps the workpiece 130 in each of the regions 112-1 and 112-2 to 112-$n$, as shown in FIG. 4. Additionally, the magnets 126 can be arranged to corresponding to the regions 112-1 and 112-2 to 112-$n$ and the workpieces 130.

Figure 5:
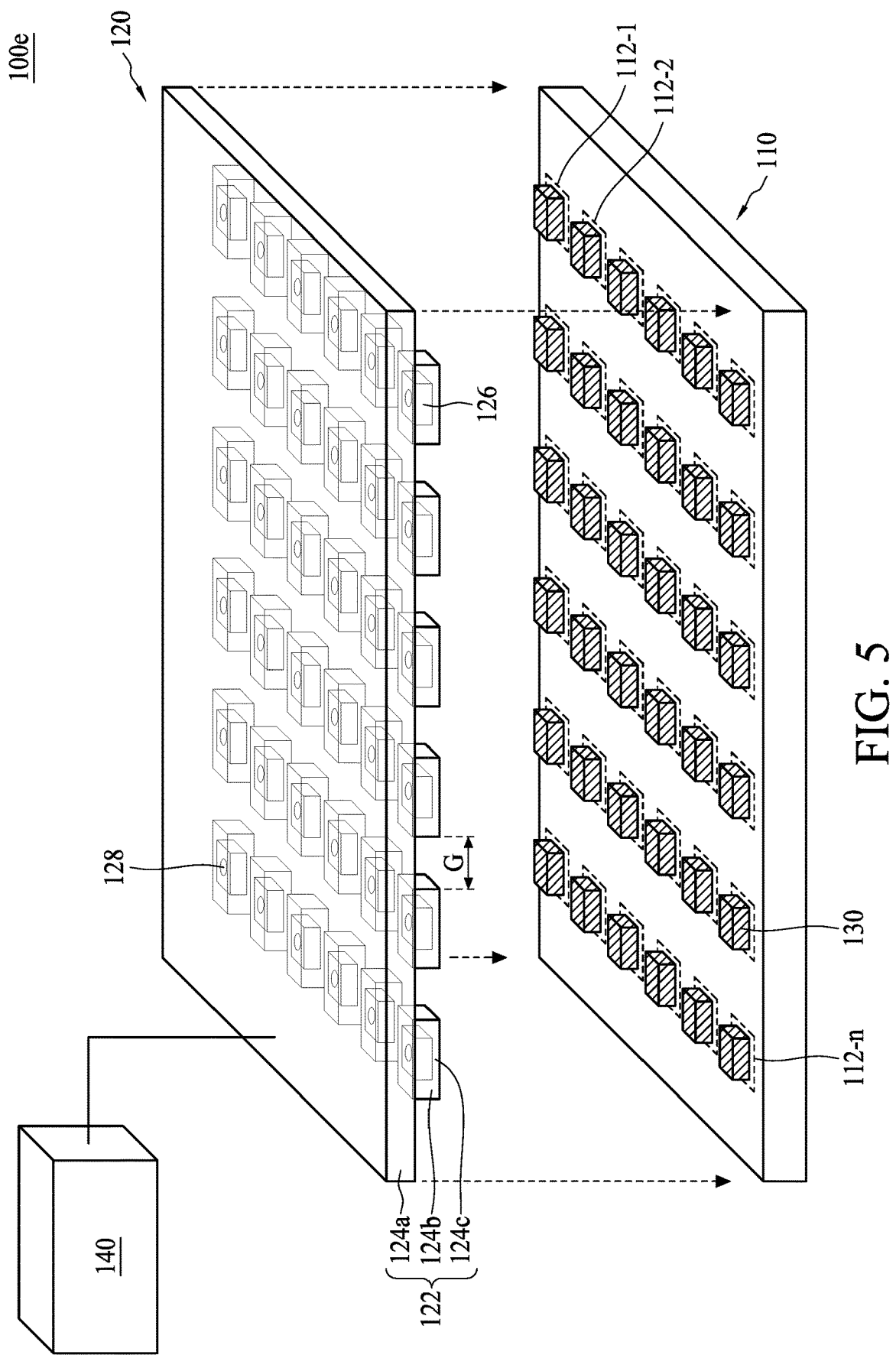
FIG. 5 is a schematic drawing illustrating a test apparatus according to aspects of the present disclosure.

FIG. 5 is a schematic drawing illustrating a test apparatus according to aspects of the present disclosure. It should be noted that same elements in FIGS. 1 and 5 are indicated by the same numerals, and details of the same elements shown in FIGS. 1 and 5 are omitted in the description of FIG. 5 for brevity. In some embodiments, a test apparatus 100$e$ is provided. The test apparatus 100$e$ can include a tray 110 that is similar to the tray shown in FIG. 1, 2, 3 or 4. The test apparatus 100$e$ can include a cap 120 that is similar to the cap shown in FIG. 1, 2, 3 or 4. In some embodiments, one or more of the magnets 126 of the cap 120 include one or more electromagnets. Further, the test apparatus 100$e$ includes a power supply system 140 electrically connected to the magnets 126 and configured to provide a current to the electromagnets. In some embodiments, a strength of a magnetic field generated by the magnets 126 can be adjusted by increasing or reducing the current from the power supply system 140.

For example, when a first magnetic field strength and a second magnetic field strength greater than the first magnetic field strength are simultaneously needed in one test, a first current is provided to a magnet 126 to generate the first magnetic field having the first magnetic field strength, and a second current greater than the first current is provided on another magnet 126 to generate the second magnetic field having the second magnetic field strength. By providing different currents to different magnets 126, magnetic fields with different strengths can be obtained.

Figure 6A:
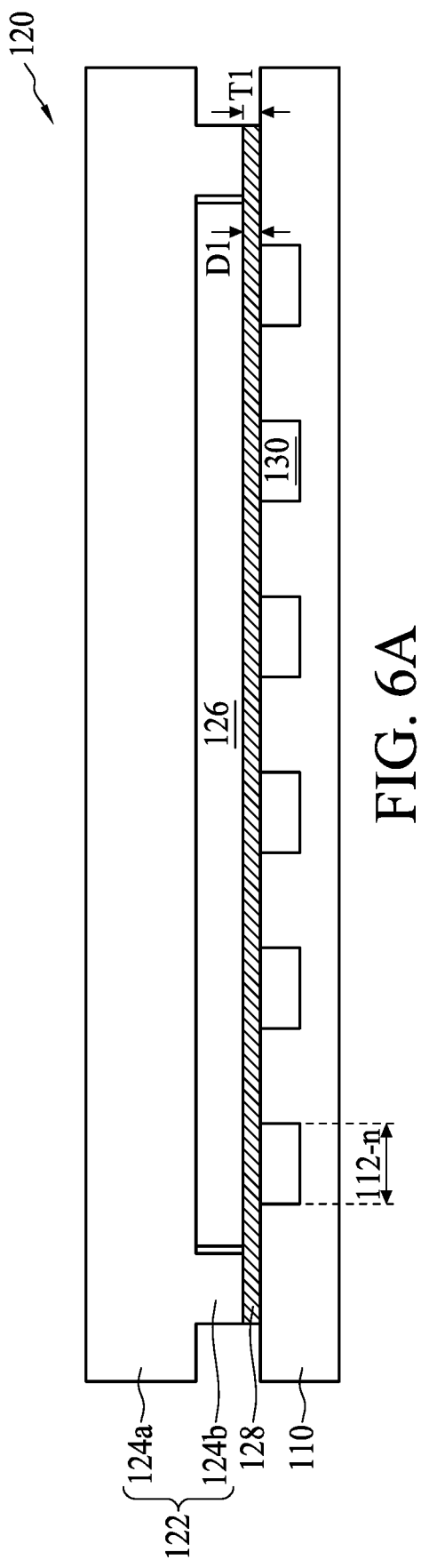
FIGS. 6A and 6B are cross-sectional views of test apparatus according to aspects of the present disclosure.
Figure 6B:

FIGS. 6A and 6B are cross-sectional views of a test apparatus according to aspects of the present disclosure. It should be noted that same elements in FIGS. 1, 6A and 6B are indicated by the same numerals, and details of the same elements shown in FIGS. 1, 6A and 6B are omitted in the descriptions of FIGS. 6A and 6B for brevity. In some embodiments, the adjustment member 128 includes a gasket. The gasket may include or be made of non-magnetic materials such as, for example but not limited thereto, non-magnetic metal, ceramic, polymer, or the like. As mentioned above, the adjustment member 128 can be disposed over the separating member 124$b$, and thus the magnet 126 is disposed within the space formed by the base 124$a$, the separating member 124$b$ and the adjustment member 128. Significantly, the adjustment member 128 is configured to adjust a vertical distance between the magnet 126 and the tray 110. In some embodiments, a gasket with a thickness is used to determine the distance between the magnet 126 and the tray 110. For example, in a test, if a first magnetic field with a first magnetic field strength is needed, a gasket with a first thickness T1 can be used and thus a first vertical distance D1 between the magnet 126 and the tray 110 or the workpieces 130 is obtained, as shown in FIG. 6A. In another test, if a second magnetic field with a second magnetic field strength less than the first magnetic field strength is needed, a gasket with a second thickness T2 greater than the first thickness T1 can be used, and thus a second vertical distance D2 greater than the first vertical distance D1 is obtained, as shown in FIG. 6B. By using different adjustment members 128, the vertical distances D1 and D2 between the magnet 126 and the tray 110 (or the workpieces 130) in different tests can be easily adjusted. Therefore the tray 110 and the workpieces 130 can be subjected to magnetic fields of different strengths in different tests without changing the magnet 126. Additionally, the adjustment member 128, i.e., the gasket, can be in contact with the workpieces 130 to be tested, as shown in FIGS. 6A and 6B, but the disclosure is not limited thereto.

Figure 7B:
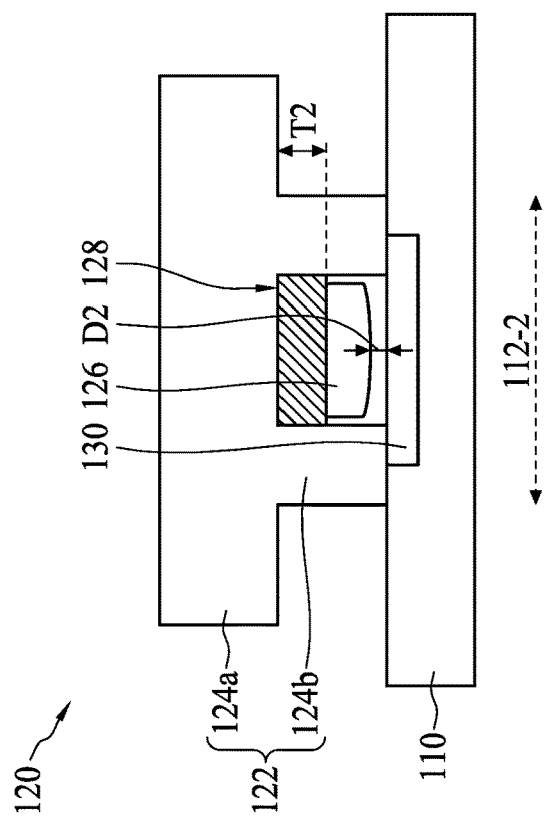
FIGS. 7A and 7B are cross-sectional views of a test apparatus according to aspects of the present disclosure.
Figure 7A:
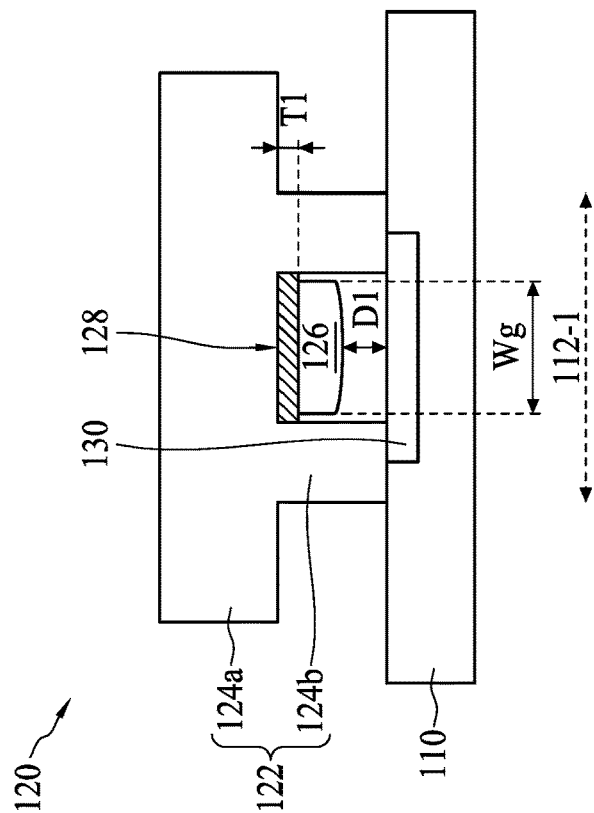

FIGS. 7A and 7B are cross-sectional views of a test apparatus according to aspects of the present disclosure. It should be noted that same elements in FIGS. 2, 7A and 7B are indicated by the same numerals, and details of the same elements shown in FIGS. 2, 7A and 7B are omitted in the description of FIGS. 7A and 7B for brevity. In some embodiments, each of the adjustment members 128 is disposed between the base 124$a$ and the corresponding magnet 126. In some embodiments, the adjustment member 128 includes a gasket. In such embodiments, the magnet 126 can be attached to the adjustment member 128. By disposing gaskets with different thicknesses, a distance between the magnet 126 and the base 124a of the cap 120, or a vertical distance between the magnet 126 and the tray (and the workpiece 130) can be adjusted. For example, when a first magnetic field and a second magnetic field with different strengths are simultaneously needed in a test, one of the adjustment members 128 having a first thickness T1 can be disposed between the base 124a of the cap 120 and the magnet 126 to adjust the distance between the magnet 126 and the base 124a of the cap 120, and thus a first vertical distance D1 between the magnet 126 and the tray 110 (and the workpiece 130 in the region 112-1) is obtained, as shown in FIG. 7A. Further, another adjustment member 128 having a second thickness T2 greater than the first thickness T1 can be disposed between the base 124a of the cap 120 and the magnet 126, and thus a second vertical distance D2 less than the first distance D1 is obtained in the second region 112-2, as shown in FIG. 7B. By using the adjustment members 128 with different thicknesses, different vertical distances D1 and D2 between the magnets 126 and the tray 110 (and the workpieces 130 in different regions 112-1 and 112-2) can be easily obtained. Further, the tray 110 and the workpieces 130 can be subjected to magnetic fields with different strengths in one test without changing the magnets 126. Additionally, in some embodiments, the separating member 124b of the cap body 122 can be in contact with the workpieces 130, as shown in FIGS. 7A and 7B, but the disclosure is not limited thereto.

Additionally, a width Wg of the gasket can be between approximately 10 mm and approximately 20 mm, but the disclosure is not limited thereto. However, it should be understood that the width W of the gasket can be modified depending on chip size.

Figure 8B:
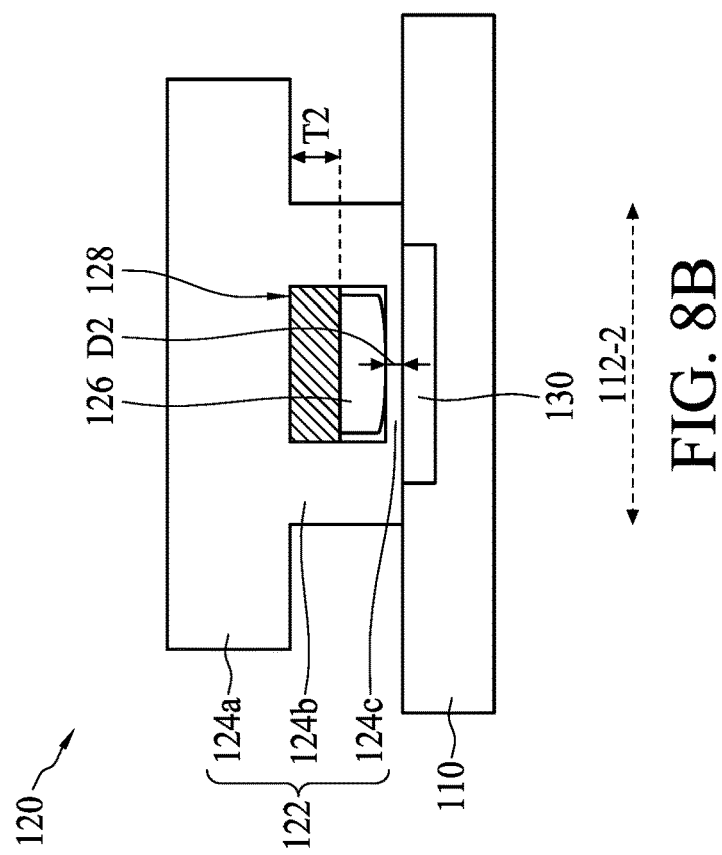
FIGS. 8A and 8B are cross-sectional views of a test apparatus according to aspects of the present disclosure.
Figure 8A:
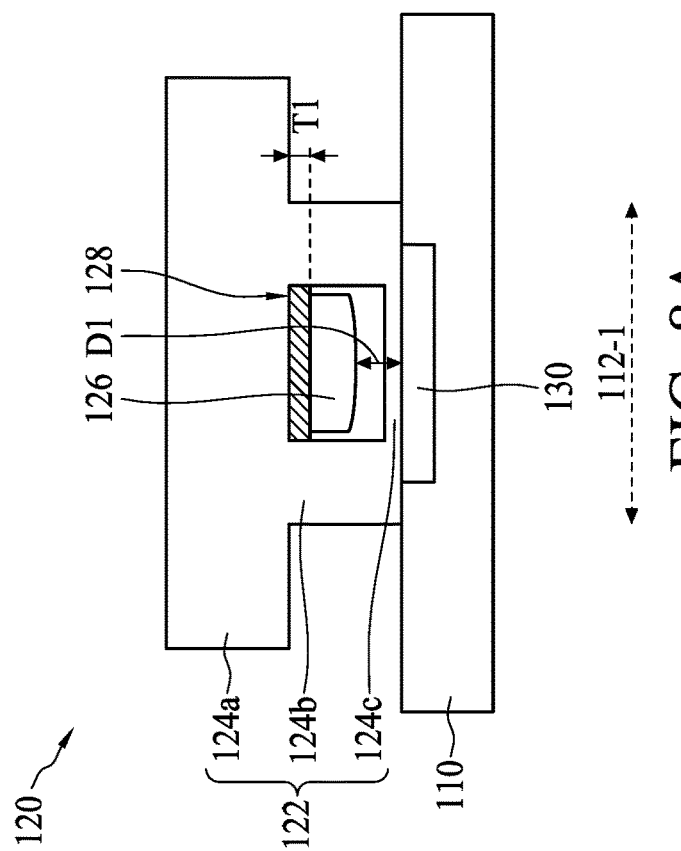

FIGS. 8A and 8B are cross-sectional views of a test apparatus according to aspects of the present disclosure. It should be noted that same elements in FIGS. 7A to 7B and 8A to 8B are indicated by the same numerals, and details of the same elements shown in FIGS. 7A to 7B and FIGS. 8A to 8B are omitted in the description of FIGS. 8A and 8B for brevity. Further, only the differences are discussed for brevity. In some embodiments, the cap body 120 further includes the sealing member 124c, the sealing member 124c can be in contact with the workpieces 130 to be tested, as shown in FIGS. 8A and 8B, but the disclosure is not limited thereto.

FIGS. 9A and 9B are cross-sectional views of a test apparatus according to aspects of the present disclosure. It should be noted that same elements in FIGS. 2, 9A and 9B are indicated by the same numerals, and details of the same elements shown in FIGS. 2, 9A and 9B are omitted in the description of FIGS. 9A and 9B for brevity. In some embodiments, the adjustment member 128 includes a spiral structure, and the magnet 126 can be fixed to the spiral structure. For example, the spiral structure can be a screw, and the magnet 126 is fixed to the screw. By rotating the screw clockwise or counterclockwise, a distance between the magnet 126 and the base 124a of the cap 120, or a vertical distance between the magnet 126 and the tray (and also the workpiece 130) can be adjusted. For example, when a first magnetic field and a second magnetic field with different strengths are simultaneously needed in a test, one of the adjustment members 128 can be rotated to adjust the distance between the magnet 126 and the base 124a of the cap 120, and thus a first vertical distance D1 between the magnet 126 and the tray 110 (and the workpiece 130 in the first region 112-1) is obtained, as shown in FIG. 9A. Further, another adjustment member 128 can be rotated to adjust the distance between another magnet 126 and the base 124a of the cap 120, and thus a second vertical distance D2 greater than the first vertical distance D1 is obtained in the second region 112-2, as shown in FIG. 9B. By using the adjustment members 128, different vertical distances D1 and D2 between the magnets 126 and the tray 110 (and the workpieces 130 in different regions 112-1 and 112-2) are obtained. Further, the tray 110 and the workpieces 130 can be subjected to magnetic fields with different strengths in one test without changing the magnets 126. Additionally, the sealing member 124c of the cap body 122 can be in contact with the workpieces 130, as shown in FIGS. 9A and 9B, but the disclosure is not limited thereto.

Additionally, a width Ws of the separating member 124b can be similar to or greater than a width of the regions 112-1 and 112-2 to 112-n. For example, the width Ws of the separating member 124b can be between approximately 10 mm and approximately 30 mm, but the disclosure is not limited thereto. A width Wm of the magnet 126 can be between approximately 5 mm and approximately 15 mm, but the disclosure is not limited thereto. A thickness Tm of the magnet 126 can be between approximately 1 mm and approximately 5 mm, but the disclosure is not limited thereto. However, it should be understood that such parameters, i.e., the width Ws of the separating member 124b, the width Wm of the magnet 126 and the thickness Tm of the magnet 126 can be modified depending on chip size and the required magnetic field strength.

FIGS. 10A and 10B are cross-sectional views of a test apparatus according to aspects of the present disclosure. It should be noted that same elements in FIGS. 9A to 9B and 10A to 10B are indicated by the same numerals, and details of the same elements shown in FIGS. 9A to 9B and 10A to 10B are omitted in the description of FIGS. 10A and 10B for brevity. Further, only the differences are discussed for brevity. In some embodiments, each of the adjustment members 128 further includes a flexible gasket 129, and the magnet 126 is disposed between the spiral structure and the flexible gasket 129. Accordingly, the magnet 126 can be secured within the space formed by the base 124a, the separating member 124b and the sealing member 124c.

Additionally, a width Wg of the flexible gasket 129 can be between approximately 10 mm and approximately 20 mm, but the disclosure is not limited thereto. A thickness Tg of the flexible gasket 129 is changeable depending on the force applied thereon. In some embodiments, the thickness Tg of the flexible gasket 129 can be between approximately 1 mm and approximately 5 mm, but the disclosure is not limited thereto. However, it should be understood that such parameters, i.e., the width Wg and the thickness Tg of the flexible gasket 129, can be modified depending on chip size.

In some embodiments, the magnetic field strength is related to the vertical distance between the magnet 126 and the tray 110 or the workpiece 130. In a non-limiting embodiment, the vertical distance between the magnet 126 and the workpiece 130 can be determined according to the formula:

$$F = Fm \times (1/d^2)$$

wherein F is referred to as a field at the surface of workpiece 130, Fm is referred to as a field at the surface of magnet 126, and d is referred to as the vertical distance between the surface of the workpiece 130 and the surface of the magnet 126.

Referring to FIGS. 6A and 6B, in some embodiments, after determining the vertical distance D1 or D2 between the magnet 126 and the workpiece 130, an adjustment member 128 having a thickness similar to such vertical distance is chosen. Therefore, a magnetic field with a target magnetic field strength can be obtained.

Referring to FIGS. 7A and 7B and FIGS. 8A and 8B, in some embodiments, after determining the vertical distances D1 and D2, adjustment members 128 having a thickness inversely proportional that vertical distances D1 and D2 are chosen and disposed between the magnet 126 and the base 124a, respectively. Therefore a magnetic field with a target magnetic field strength can be obtained.

Referring to FIGS. 9A and 9B and FIGS. 10A and 10B, in some embodiments, after determining the vertical distances D1 and D2, the adjustment members 128 are respectively rotated to raise or lower the magnet 126 to that vertical distances D1 and D2. Therefore a magnetic field with a target magnetic field strength can be obtained.

Figure 11:
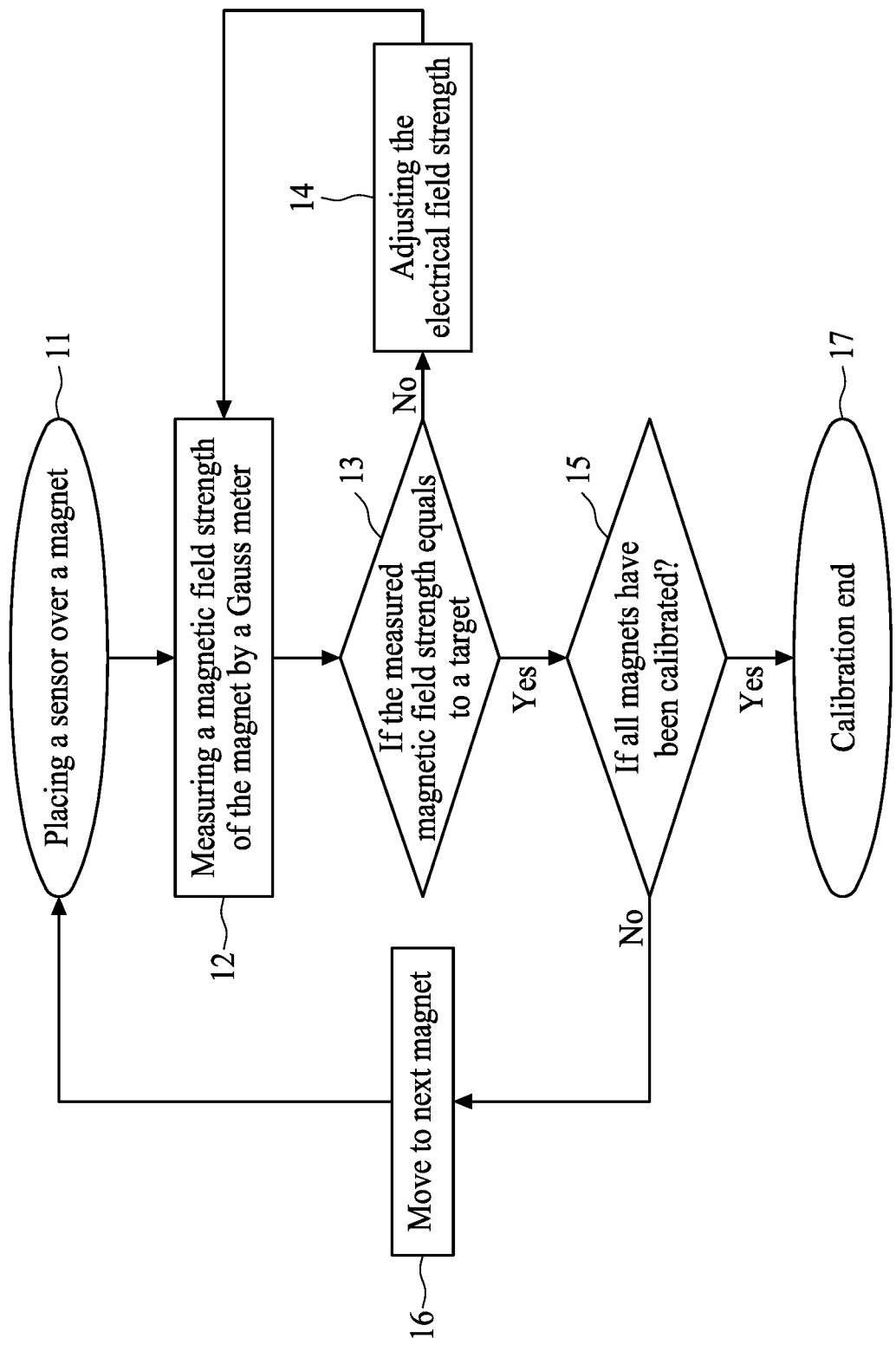
FIG. 11 is a flowchart representing a method for calibrating a magnetic field generating cap according to aspects of the present disclosure.
Figure 12:
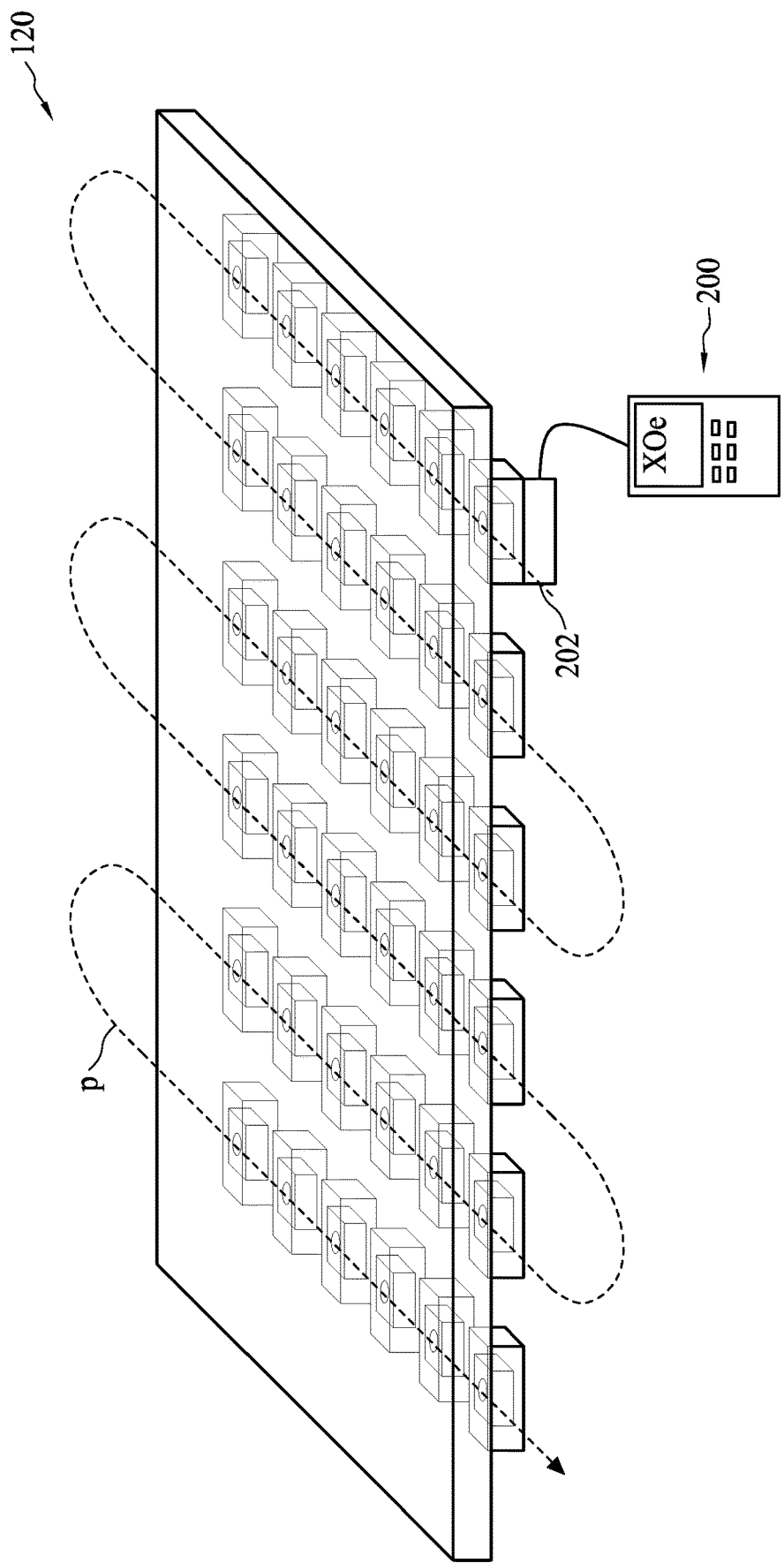
FIG. 12 is a schematic drawing illustrating a stage of the method for calibrating the magnetic field generating cap according to aspects of the present disclosure.

FIG. 11 is a flowchart representing a method for calibrating a magnetic field generating cap according to aspects of the present disclosure, and FIG. 12 is a schematic drawing illustrating a stage of the method for calibrating the magnetic field generating cap according to aspects of the present disclosure. The method 10 includes a number of operations (11, 12, 13, 14, 15, 16 and 17). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

The method for calibrating the magnetic field generating cap 10 can be performed after choosing the adjustment member 128, adjusting the adjustment member 128 or adjusting the current applied to the electromagnet. In some embodiments, the magnetic field generating cap can be the cap 120 as shown in FIG. 1, 2, 3, 4 or 5.

At operation 11, a sensor 202 is placed over a magnet. In some embodiments, the sensor 202 is electrically connected to a Gauss meter 200, as shown in FIG. 12. In some embodiments, the sensor 202 can be in contact with the sealing member 124c. In some embodiments, the sensor 202 can be in contact with the adjustment member 128. In other embodiments, the sensor 202 can be in contact with the separating member 124b. In some embodiments, a vertical distance between the sensor 202 and the magnet 126 can be equal to the vertical distance between the magnet 126 and the workpiece 130.

At operation 12, a magnetic field strength of the magnet is measured by the Gauss meter. In some embodiments, the measured magnetic field strength is a real magnetic field that is provided on the workpiece 130 over the tray 110.

At operation 13, the measured magnetic field strength is checked to determine whether the measured magnetic field strength equals a target magnetic field strength or not.

At operation 14, when the result of operation 13 is negative (i.e., the measured magnetic field strength does not equal the target magnetic field strength), the magnetic field strength is adjusted. In some embodiments, the adjustment can be performed by adjusting the current applied to the magnet 126. In some embodiments, different adjustment member 128, such as the gasket, having a different thickness is used to adjust the distance between the sensor 202 and the magnet 126. In other embodiments, the adjustment member 128, such as the screw, is rotated clockwise or counterclockwise to adjust the distance sensor 202 and the magnet 126.

In some embodiments, the adjustment of the screw can be performed manually. After the adjustment, the method returns to operation 12.

At operation 15, when the result of operation 13 is positive (i.e., the measured magnetic field strength equals the target magnetic field strength), the method proceeds to determine whether all the magnets 126 have been calibrated.

At operation 16, when the result of operation 15 is negative, the sensor 202 is moved to next a magnet 126, and the method returns to operation 11. Referring to FIG. 12, in some embodiments, operation 16 can be performed on the next magnet 126 along a calibration path P, but the disclosure is not limited thereto.

At operation 17, when the result of operation 15 is positive, the calibration is completed and the method 10 is ended.

Figure 13:
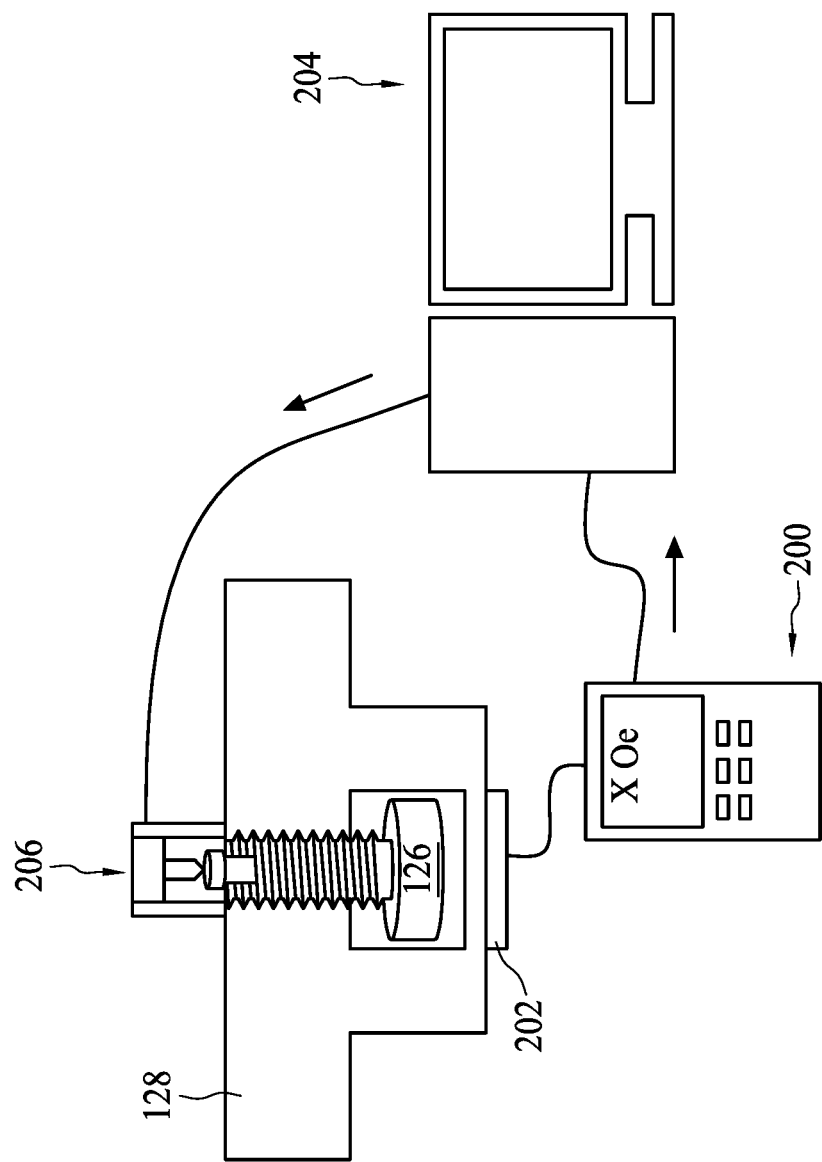
FIG. 13 is a schematic drawing illustrating some embodiments of the method for calibrating the magnetic field generating cap according to aspects of the present disclosure.

FIG. 13 is a schematic drawing illustrating a stage of the method for calibrating a magnetic field generating cap according to aspects of the present disclosure. In some embodiments, the method 10 can be performed manually. In some alternative embodiments, a control system 204 and an adjusting tool 206, such as a screwdriver, can be provided to perform the method 10. In such embodiments, the Gauss meter 200 is electrically connected to the control system 204, and a signal related to the measurement of the magnetic field strength is sent to the control system 204. The control system 204 may perform operation 13 to determine whether the measured magnetic field strength equals a target magnetic field strength. In addition, different target magnetic field strengths can be stored in a database in the control system 204. The control system 204 can be electrically connected to the adjusting tool 206. In some embodiments, at operation 14, when the result of operation 13 is negative, a signal is sent from the control system 204 to the adjusting tool 206. The adjusting tool 206 can automatically adjust the adjustment member 128 by, for example but not limited to, rotating the screw to raise or lower the magnet 126.

Figure 14:
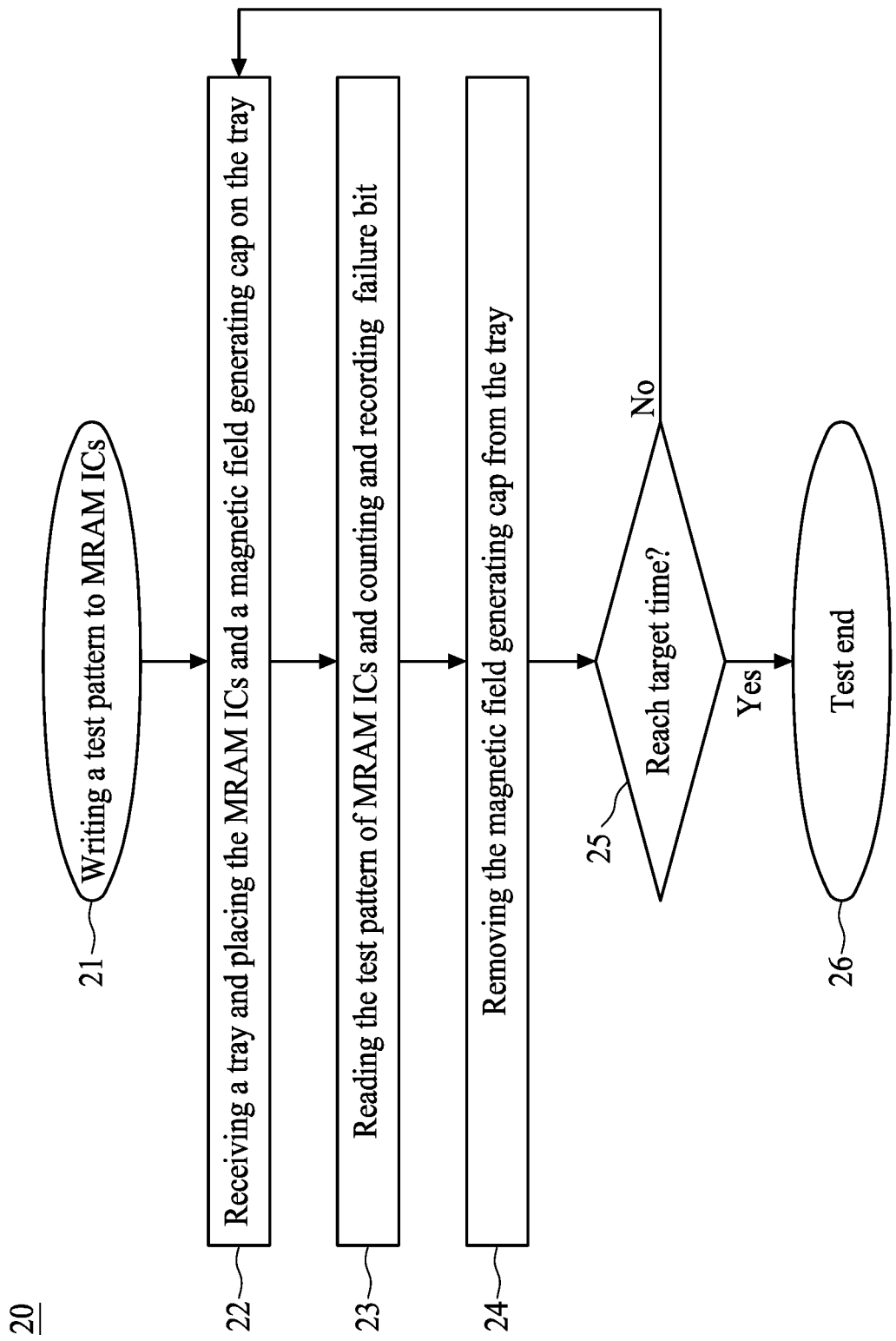
FIG. 14 is a flowchart representing a method for testing according to aspects of the present disclosure.

FIG. 14 is a flowchart representing a method for testing 20 according to aspects of the present disclosure. The method for testing 20 includes a number of operations (21, 22, 23, 24, 25 and 26). The method for testing 20 will be further described according to one or more embodiments. It should be noted that the operations of the method for testing 20 may be rearranged or otherwise modified within the scope of the various aspects. It should be further noted that additional processes may be provided before, during, and after the method 20, and that some other processes may be only briefly described herein. Thus other implementations are possible within the scope of the various aspects described herein.

In some embodiments, the workpiece 130 to be tested can be an MRAM IC, but the disclosure is not limited thereto.

At operation 21, a test pattern is written to the MRAM ICs. In some embodiments, the test pattern can be a checkerboard (CKBD) pattern, but the disclosure is not limited thereto. In some embodiments, the MRAM ICs can be same devices. In some embodiments, the MRAM ICs can be different devices.

It should be understood that the MRAM is often based on a magnetic tunnel junction (MTJ) cell. An MTJ cell includes three basic layers: a free ferromagnetic layer, an insulating tunneling barrier and a pinned ferromagnetic layer. The magnetization moments of the free ferromagnetic layer are free to rotate under an external magnetic field. The pinned ferromagnetic layer can comprise a ferromagnetic layer and/or an anti-ferromagnetic layer that pins the magnetic moments in the ferromagnetic layer. Thus, the magnetization moment of the pinned ferromagnetic layer is pinned in a fixed direction. A very thin insulation layer forms the tunneling barrier between the pinned and free ferromagnetic layers.

The MTJ cell can be electrically represented as a resistor. The amount of resistance provided by the resistor depends upon the orientation of the magnetization of the free ferromagnetic layer and the pinned ferromagnetic layer. As is understood by those skilled in the art, the MTJ cell has a relatively high resistance when the magnetic vectors are opposing (point in opposite directions) and a relatively low resistance when the magnetic vectors are aligned. That is, an MTJ cell stores a bit of information as the relative orientation of the magnetizations of the free ferromagnetic layer and the pinned ferromagnetic layer. In other words, the magnetization of each MTJ cell at any given time assumes one of two stable orientations. These two stable orientations, referred to as "parallel" and "anti-parallel" magnetic orientation, represent logic values of 0 and 1, for example. To write or change the state in the MTJ cell, an external magnetic field can be applied that is sufficient to completely switch the stable orientation of the magnetization of the free ferromagnetic layer.

At operation 22, the MRAM ICs are placed on a tray and a magnetic field generating cap is placed on the tray. In some embodiments, the tray 110 as mentioned above can be used in operation 22, but the disclosure is not limited thereto. The placement and arrangement of the MRAM ICs on the tray 110 can be similar to those of the workpieces described above; therefore, such details are omitted in the description. The magnetic field generating cap can be the cap 120 as shown in FIG. 1, 2, 3, 4 or 5; therefore, such details are omitted in the description. In some embodiments, the magnetic field strength of each of the magnets 126 of the cap 120 is adjusted prior to operation 22. In some embodiments, the operations of the method for calibrating the magnetic field generating cap 10 can be performed prior to the performing of the operations of the method 20. In some embodiments, the MRAM ICs over the tray 110 may be subjected to magnetic fields with magnetic field strengths that are same as or different from magnetic field strengths of the magnets 126 of the cap 120. Consequently, different influences are applied to the MRAM ICs. It should be noted that because the test pattern is written to the MTJ cell when an external magnetic field is applied, the strength of the external magnetic field is critical to the MTJ cells, and thus it is important to obtain a magnetic properties characterization for the MRAM ICs.

At operation 23, the test pattern of the MRAM ICs is read, and failure bits are counted and recorded.

To read the pattern in the MTJ cell of the MRAM ICs, a read current can be applied through the MTJ cell. As the magneto-resistance varies according to the state stored in the MTJ cell, the logic state of the MTJ memory device can be sensed by obtaining the voltage difference across the MTJ cell. Further, because the MRAM ICs are read when the external magnetic field is applied thereto, the influences from the external magnetic field can be obtained. The influences and/or the device may have failure bit, and the failure bits are counted and recorded.

At operation 24, the cap is removed from the tray. In some embodiments, the magnetic field generating cap 120 is removed from the tray 110 and the MRAM ICs.

At operation 25, it is determined whether a target time is reached. When the result of operation 25 is negative, the method returns to operation 22.

At operation 26, when result of operation 25 is positive, the test is completed and the method 20 is ended.

Figure 15:
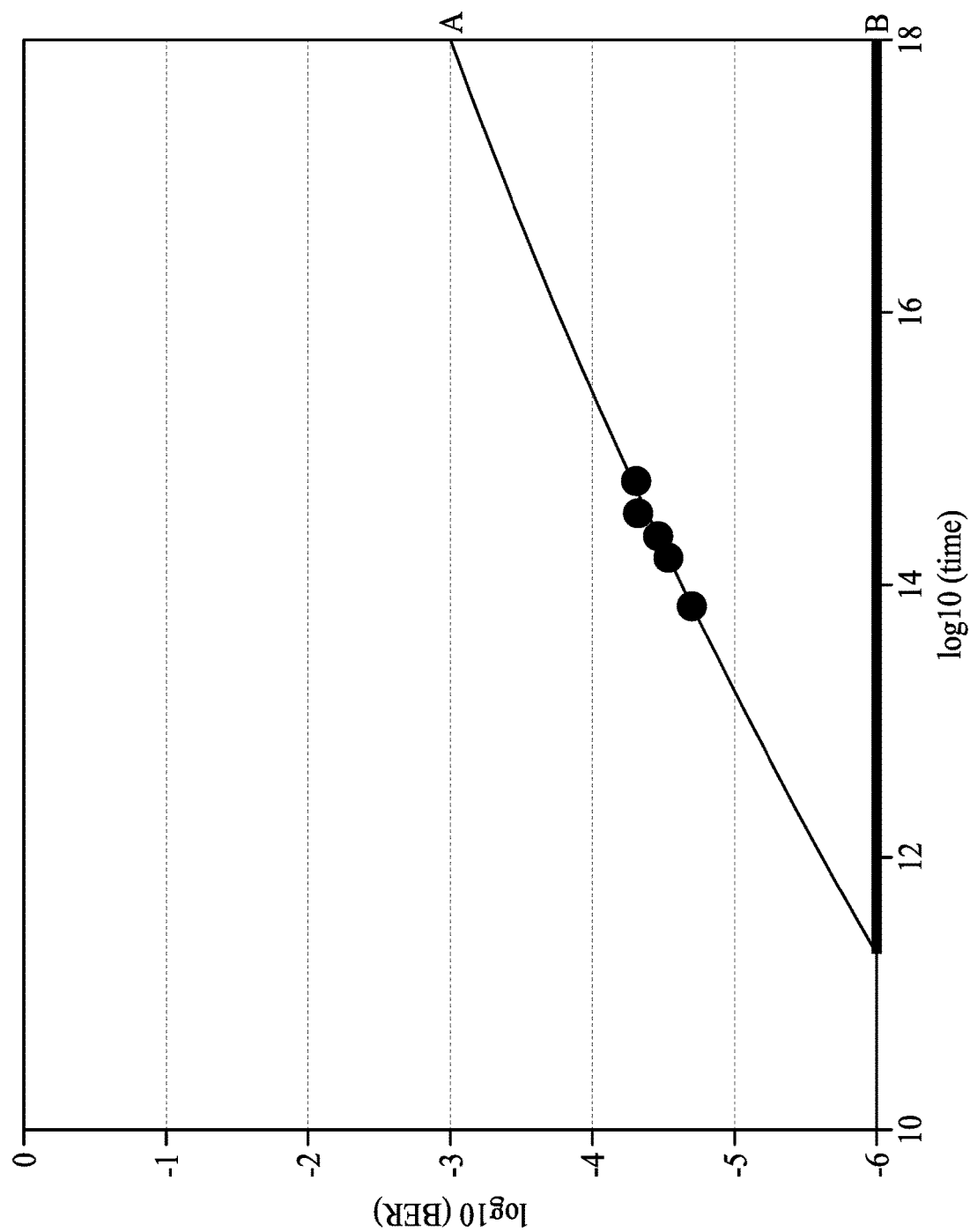
FIG. 15 is a diagram illustrating a characterization result according to aspects of the present disclosure.

FIG. 15 is a diagram illustrating a characterization result according to aspects of the present disclosure. In some embodiments, after the method for testing 20, a bit error rate (BER) is calculated. The bit error rate is defined as the number of errors measured divided by the number of repetitions of read/write operations. As shown in FIG. 15, line A shows that the bit error rate has an obvious relationship with time. In some comparative embodiments, when no cap is used or a cap without a magnetic field generating function is used, a result is as depicted as line B in FIG. 15. The result is useful in characterizing parameters, i.e., the magnetic field, and functioning of the MRAM ICs because the relationship between the bit error rate and time as shown in line A is more obvious than that shown in line B. In some embodiments, when the MRAM ICs are the same but magnetic fields with different strengths are provided, MRAM magnetic field characterization can be easily obtained.

Figure 16:
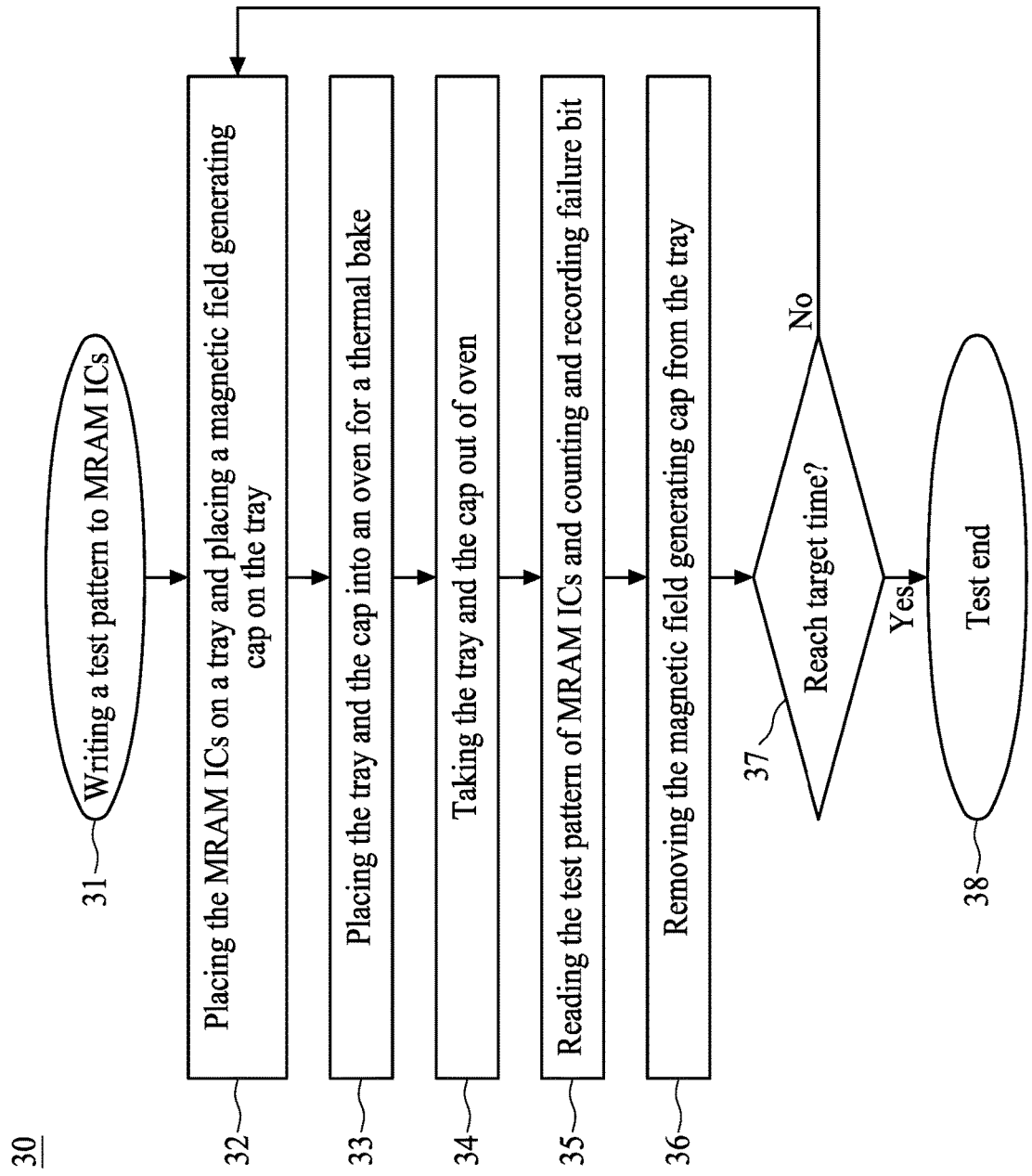
FIG. 16 is a flowchart representing a method for testing according to aspects of the present disclosure.
Figure 17:
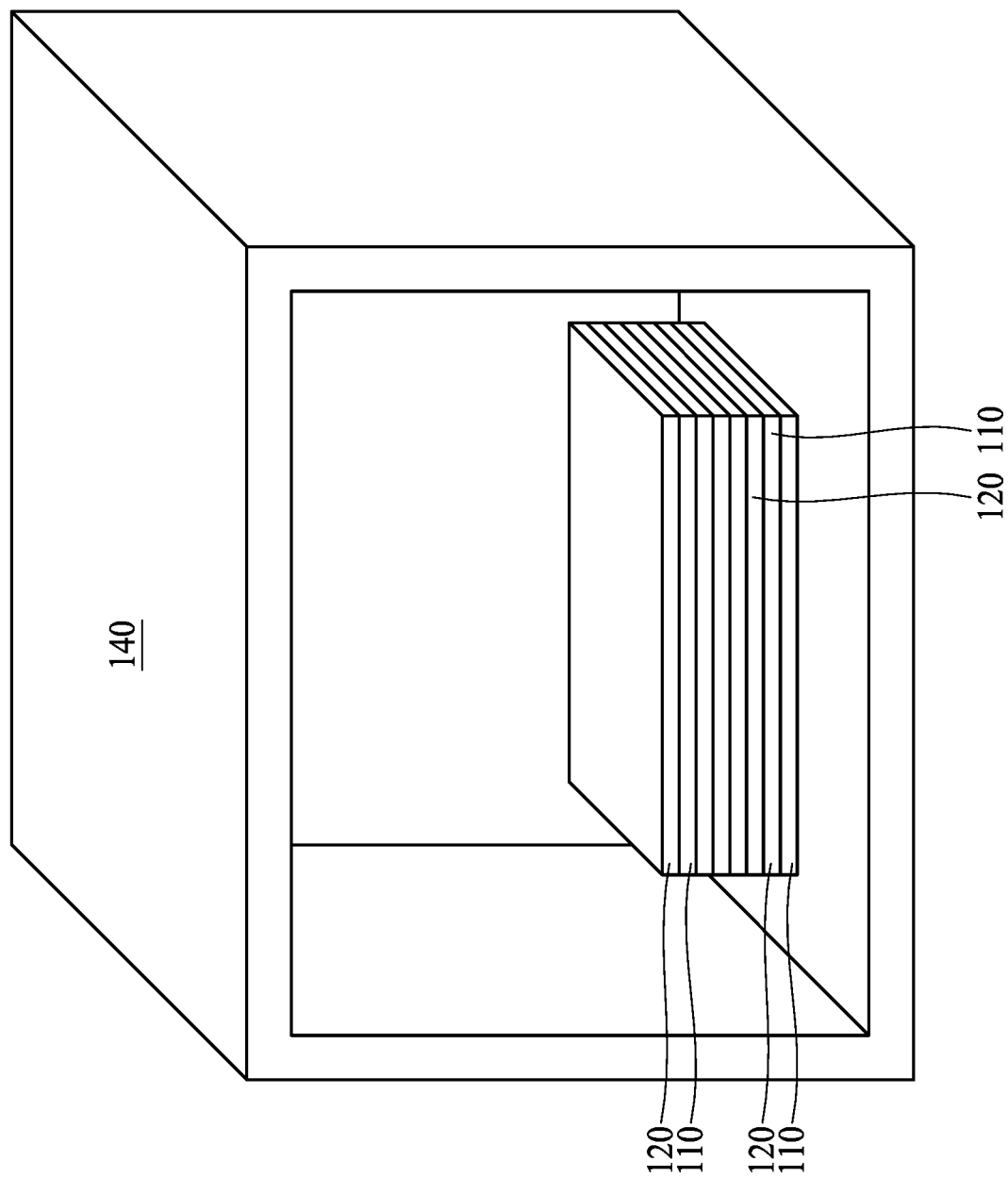
FIG. 17 is a schematic drawing illustrating a stage of the method for test according to aspects of the present disclosure.

FIG. 16 is a flowchart representing a method for testing 30 according to aspects of the present disclosure, and FIG. 17 is a schematic drawing illustrating a stage of the method for test according to aspects of the present disclosure. The method for testing 30 includes a number of operations (31, 32, 33, 34, 35, 36, 37 and 38). The method for testing 30 will be further described according to one or more embodiments. It should be noted that the operations of the method for test 30 may be rearranged or otherwise modified within the scope of the various aspects. It should be further noted that additional processes may be provided before, during, and after the method 30, and that some other processes may be only briefly described herein. Thus, other implementations are possible within the scope of the various aspects described herein. Additionally, some operations in the method 30 may be similar to operations in the method 20, and details of the same operations are omitted in the description for brevity.

In some embodiments, the workpieces 130 to be tested can be MRAM ICs, but the disclosure is not limited thereto.

At operation 31, a test pattern is written to the MRAM ICs.

At operation 32, the MRAM ICs are placed on a tray and a cap is placed on the tray. In some embodiments, the tray 110 as mentioned above can be used in operation 22, but the disclosure is not limited thereto. The placement and arrangement of the MRAM ICs on the tray 110 can be similar to those of the workpieces described above; therefore, such details are omitted in the description. The magnetic field generating cap can be the cap 120 as shown in FIG. 1, 2, 3, 4 or 5; therefore, such details are omitted in the description.

At operation 33, the tray and the cap are placed into an oven for a thermal bake. In some embodiments, when temperature characterization is also needed, the cap 120 and the tray 110, together with the MRAM ICs, are placed into an oven for a thermal bake. Further, in some embodiments, sets of the tray 110 and the cap 120 can be stacked and a stack of sets of the tray 110 and cap 120 is placed into an oven 150, as shown in FIG. 17. In some embodiments, the thermal bake is performed at a temperature between approximately 25° C. and approximately 200° C., but the disclosure is not limited thereto. In some embodiments, the thermal bake is performed in an operation period between approximately 1 hours and approximately 1000 hours, but the disclosure is not limited thereto.

At operation 34, the tray and the cap are taken out of the oven when the thermal bake is completed.

At operation 35, the test pattern of the MRAM ICs is read, and failure bits are counted and recorded. In some embodiments, the magnets 126 of the cap 120 provide constant and steady magnetic fields while the thermal bake is performed.

At operation 36, the cap is removed from the tray.

At operation 37, it is determined whether a target time is reached. When the result of operation 37 is negative, the method returns to operation 33.

At operation 38, when result of operation 37 is positive, the test is completed and the method is ended.

It will be appreciated that in the forgoing methods, the workpieces to be tested are subjected to magnetic fields of different strengths generated from the cap, and therefore a magnetic properties characterization can be easily obtained. Additionally, when temperature characterization is required, the method and the set of tray and cap help to obtain such characterization. Further, the cap includes the adjustment member or power supply system that is able to adjust magnetic field strength. Accordingly, the cap, which generates magnetic fields of different strengths, can be re-used in different tests.

According to some embodiments of the present disclosure, a cap for a test apparatus is provided. The cap includes a cap body, a plurality of magnets disposed over the cap body, and a plurality of adjustment members. In some embodiments, each adjustment member is disposed between the cap body and one corresponding magnet. In some embodiments, a vertical distance between the cap body and each magnet is adjusted by one corresponding adjustment member.

According to some embodiments of the present disclosure, a test apparatus is provided. The test apparatus includes a tray including at least a first region and a second region, and a cap disposed over the tray. The cap includes a cap body and at least a first magnet and a second magnet disposed over the cap body. In some embodiments, the first magnet is configured to provide a first magnetic field to the first region of the tray, and the second magnet is configured to provide a second magnetic field to the second region of the tray. In some embodiments, a strength of the first magnetic field is different from a strength of the second magnetic field.

According to some embodiments of the present disclosure, a method for testing is provided. The method includes following operations. A test pattern is written in each of a plurality of integrated circuits (ICs). In some embodiments, the ICs can include memory integrated circuits (ICs), but the disclosure is not limited thereto. A tray is received and the plurality of ICs are placed on the tray. A cap is disposed over the tray and the plurality of ICs. In some embodiments, the cap includes at least a first magnet and a second magnet. The plurality of ICs are subjected to a first magnetic field having a first magnetic field strength from the first magnet and a second magnetic field having a second magnetic field strength from the second magnet. In some embodiments, the first magnetic field strength and the second magnetic field strength are different from each other. The test pattern of each of the plurality of ICs is read.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cap for a test apparatus comprising:
a cap body;
a plurality of magnets disposed over the cap body; and
a plurality of adjustment members, wherein the each adjustment member is disposed between the cap body and one corresponding magnet,
wherein a vertical distance between the cap body and each magnet is adjusted by one corresponding adjustment member.

2. The cap of claim 1, wherein the cap body comprises:
a base; and
a plurality of separating members,
wherein the plurality of separating members separate the plurality of adjustment members from each other and separate the plurality of magnets from each other.

3. The cap of claim 2, wherein the cap body further comprises a plurality of sealing members, wherein each magnet is sealed within a space formed by the plurality of separating members and the plurality of sealing members.

4. The cap of claim 3, wherein the base, the plurality of separating members and the plurality of sealing members are made of a non-magnetic material.

5. The cap of claim 1, wherein each of the plurality of adjustment members comprises a spiral structure.

6. The cap of claim 5, wherein each of the plurality of adjustment members further comprises a flexible gasket, and each of the plurality of magnets is disposed between the adjustment unit and the flexible gasket.

7. The cap of claim 1, wherein the plurality of magnets comprise a plurality of permanent magnets or a plurality of electromagnets.

8. A test apparatus comprising:
a tray comprising at least a first region and a second region; and
a cap disposed over the tray, wherein the cap comprises:
a cap body; and
at least a first magnet and a second magnet disposed over the cap body;
wherein the first magnet provides a first magnetic field to the first region of the tray, the second magnet provides a second magnetic field to the second region of the tray, and a strength of the first magnetic field is different from a strength of the second magnetic field.

9. The test apparatus of claim 8, wherein a first vertical distance between the first magnet and the tray is different from a second vertical distance between the second magnet and the tray.

10. The test apparatus of claim 9, further comprising a plurality of adjustment members configured to adjust the first vertical distance between the first magnet and the tray and the second vertical distance between the second magnet and the tray.

11. The test apparatus of claim 10, wherein each of the adjustment members comprises a gasket.

12. The test apparatus of claim 10, wherein each of the adjustment members comprises a spiral structure.

13. The test apparatus of claim 12, wherein each of the plurality of adjustment members further comprises a flexible gasket, and the first magnet and the second magnet are respectively disposed between the spiral structure and the flexible gasket.

14. The test apparatus of claim 8, further comprising a power supply system configured to provide a first current to the first magnet and a second current to the second magnet, and the first current and the second current are different from each other.

15. The test apparatus of claim 8, wherein the first region of the tray is configured to accommodate a first workpiece, and the second region of the tray is configured to accommodate a second workpiece.

16. The test apparatus of claim 8, wherein the first region of the tray is configured to accommodate a plurality of first workpieces, and the second region of the tray is configured to accommodate a plurality of second workpieces.

17. A method for testing, comprising:
writing a test pattern to each of a plurality of integrated circuit (ICs);
receiving a tray and placing the plurality of ICs on the tray;
disposing a cap over the tray and the plurality of ICs, wherein the cap comprises at least a first magnet and a second magnet, the plurality of ICs are subjected to a first magnetic field having a first magnetic field strength from the first magnet and a second magnetic field having a second magnetic field strength from the second magnet, and the first magnetic field strength and the second magnetic field strength are different from each other; and
reading the test pattern of each of the plurality of ICs.

18. The method of claim 17, further comprising:
placing the tray and the cap into an oven;
performing a thermal baking before reading the test pattern; and
moving the tray and the cap out of the oven.

19. The method of claim 17, further comprising removing the cap from the tray and the plurality of ICs after the reading of the test pattern.

20. The method of claim 17, further comprising adjusting the first magnetic field strength and the second magnetic field strength prior to the disposing of the cap over the tray and the plurality of ICs.

* * * * *